United States Patent
Ishibashi

(10) Patent No.: US 10,403,472 B2
(45) Date of Patent: Sep. 3, 2019

(54) ION IMPLANTATION APPARATUS AND MEASUREMENT DEVICE

(71) Applicant: SUMITOMO HEAVY INDUSTRIES ION TECHNOLOGY CO., LTD., Tokyo (JP)

(72) Inventor: Kazuhisa Ishibashi, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/461,092

(22) Filed: Mar. 16, 2017

(65) Prior Publication Data
US 2017/0271127 A1 Sep. 21, 2017

(30) Foreign Application Priority Data
Mar. 18, 2016 (JP) .................................. 2016-055822

(51) Int. Cl.
- *H01J 37/244* (2006.01)
- *H01J 37/304* (2006.01)
- *H01J 37/317* (2006.01)

(52) U.S. Cl.
CPC ........ *H01J 37/3171* (2013.01); *H01J 37/244* (2013.01); *H01J 37/304* (2013.01); *H01J 2237/24405* (2013.01); *H01J 2237/24528* (2013.01)

(58) Field of Classification Search
None
See application file for complete search history.

(56) References Cited

U.S. PATENT DOCUMENTS

| | | | | |
|---|---|---|---|---|
| 3,790,412 A * | 2/1974 | Moline | ..................... | F01D 5/30 |
| | | | | 148/DIG. 106 |
| 7,679,067 B2 * | 3/2010 | Gorrell | ..................... | G01D 5/34 |
| | | | | 250/396 R |
| 2012/0199752 A1 * | 8/2012 | Desaute | .................. | G01T 1/185 |
| | | | | 250/382 |
| 2013/0057250 A1 * | 3/2013 | Kopalidis | .............. | G01N 27/62 |
| | | | | 324/71.3 |

(Continued)

FOREIGN PATENT DOCUMENTS

| JP | 04209523 A | * | 7/1992 |
|---|---|---|---|
| JP | 2006-147244 A | | 6/2006 |
| JP | 2006147244 A | * | 6/2006 |

(Continued)

*Primary Examiner* — Andrew Smyth
(74) *Attorney, Agent, or Firm* — Michael Best & Friedrich LLP

(57) ABSTRACT

An angle measurement device includes: a slit through which an ion beam is incident, and a width direction of which is orthogonal to a beam traveling direction of the ion beam toward a wafer; and a plurality of electrode bodies which are provided at positions away from the slit in the beam traveling direction, and each of which includes a beam measurement surface that is a region which is exposed to the ion beam having passed through the slit. The plurality of electrode bodies are disposed such that the beam measurement surfaces of the electrode bodies are arranged in order in the width direction of the slit and the beam measurement surfaces adjacent to each other in the width direction of the slit deviate from each other in the beam traveling direction.

16 Claims, 16 Drawing Sheets

(56) References Cited

U.S. PATENT DOCUMENTS

2015/0364297 A1 * 12/2015 Tsukihara ............ H01J 37/304
                                                                                                               250/492.21

FOREIGN PATENT DOCUMENTS

| JP | 2007278755 A | * | 10/2007 |
| JP | 2008-146863 A | | 6/2008 |
| JP | 2008146863 A | * | 6/2008 |
| JP | 2008-257931 A | | 10/2008 |

* cited by examiner

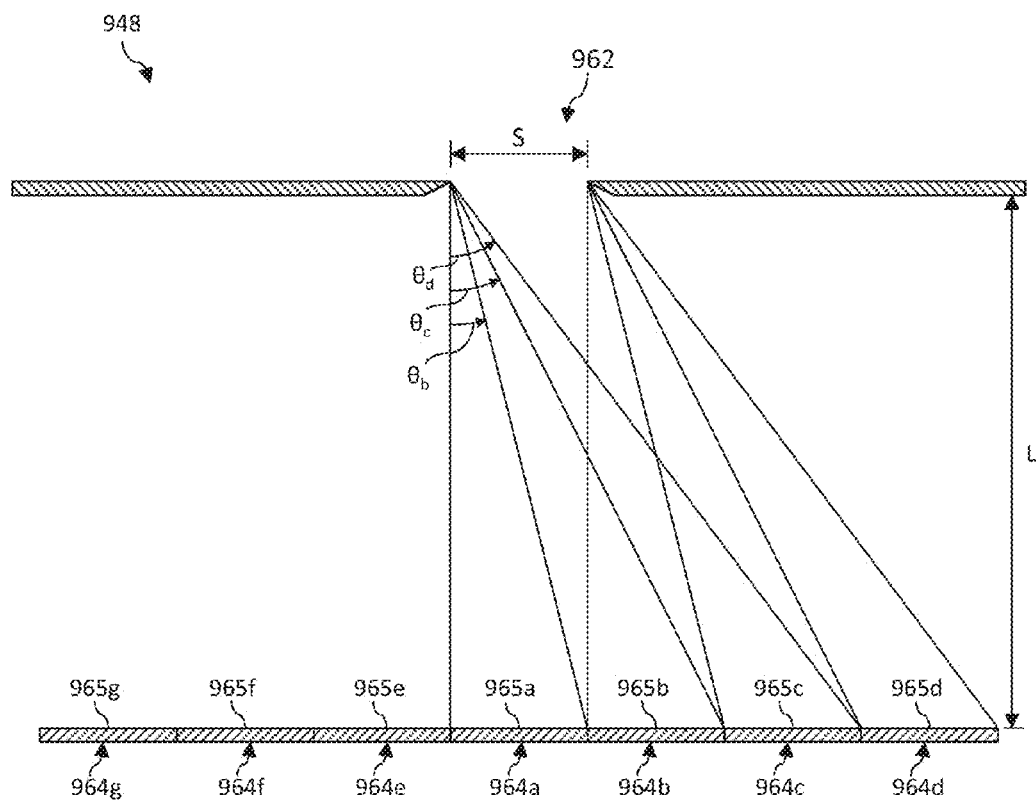

US 10,403,472 B2

ION IMPLANTATION APPARATUS AND MEASUREMENT DEVICE

RELATED APPLICATIONS

Priority is claimed to Japanese Patent Application No. 2016-055822, filed Mar. 18, 2016, the entire content of which is incorporated herein by reference.

BACKGROUND

Technical Field

Certain embodiments of the present invention relate to an ion implantation apparatus, and in particular to a technique for measuring an angle distribution of an ion beam.

Description of Related Art

In a semiconductor manufacturing process, a process of implanting ions into a semiconductor wafer (hereinafter, also referred to as an "ion implantation process") is normally carried out for the purpose of changing the conductivity of a semiconductor, the purpose of changing a crystal structure of the semiconductor, or the like. An apparatus that is used in the ion implantation process is called an ion implanter and has a function of generating ions by an ion source and accelerating the generated ions to form an ion beam, and a function of transporting the ion beam to an implantation process chamber and irradiating a wafer in the process chamber with the ion beam. In order to measure a traveling angle of the ion beam with which the wafer is irradiated, a plurality of beam detectors arranged in a direction orthogonal to a beam traveling direction are used.

SUMMARY

According to an embodiment of the present invention, there is provided an ion implantation apparatus including a measurement device configured to measure an angle distribution of an ion beam with which a wafer is irradiated. The measurement device includes: a slit through which the ion beam is incident, and a width direction of which is orthogonal to a beam traveling direction of the ion beam toward the wafer; and a plurality of electrode bodies which are provided at positions away from the slit in the beam traveling direction, and each of which includes a beam measurement surface that is a region which is exposed to the ion beam having passed through the slit. The plurality of electrode bodies are disposed such that the beam measurement surfaces of the electrode bodies are arranged in order in the width direction of the slit and the beam measurement surfaces adjacent to each other in the width direction of the slit deviate from each other in the beam traveling direction.

According to another embodiment of the present invention, there is provided a measurement device that measures an angle distribution of an ion beam. The measurement device includes: a slit through which the ion beam is incident; and a plurality of electrode bodies which are provided at positions away from the slit in a beam traveling direction, and each of which includes a beam measurement surface that is a region which is exposed to the ion beam having passed through the slit. The plurality of electrode bodies are disposed such that the beam measurement surfaces of the electrode bodies are arranged in order in a width direction of the slit and the beam measurement surfaces adjacent to each other in the width direction of the slit deviate from each other in the beam traveling direction.

According to still another embodiment of the present invention, there is provided a measurement device that measures an angle distribution of an ion beam. The measurement device includes: a slit through which the ion beam is incident; and a plurality of electrode bodies which are provided at positions away from the slit in a beam traveling direction, and each of which includes a beam measurement surface that is a region which is exposed to the ion beam having passed through the slit. The plurality of electrode bodies are disposed such that the beam measurement surfaces of the electrode bodies are arranged in a width direction of the slit without gaps therebetween and are present at the same position in the beam traveling direction, and the beam measurement surface of each of the electrode bodies has a length in the width direction of the slit which is the same as a slit width of the slit or is 1/n (n is an integer greater than or equal to two) of the slit width.

BRIEF DESCRIPTION OF THE DRAWINGS

FIG. 16 is a sectional view schematically showing the configuration of an angle measurement device according to Modified Example 9.

DETAILED DESCRIPTION

Figure 1:
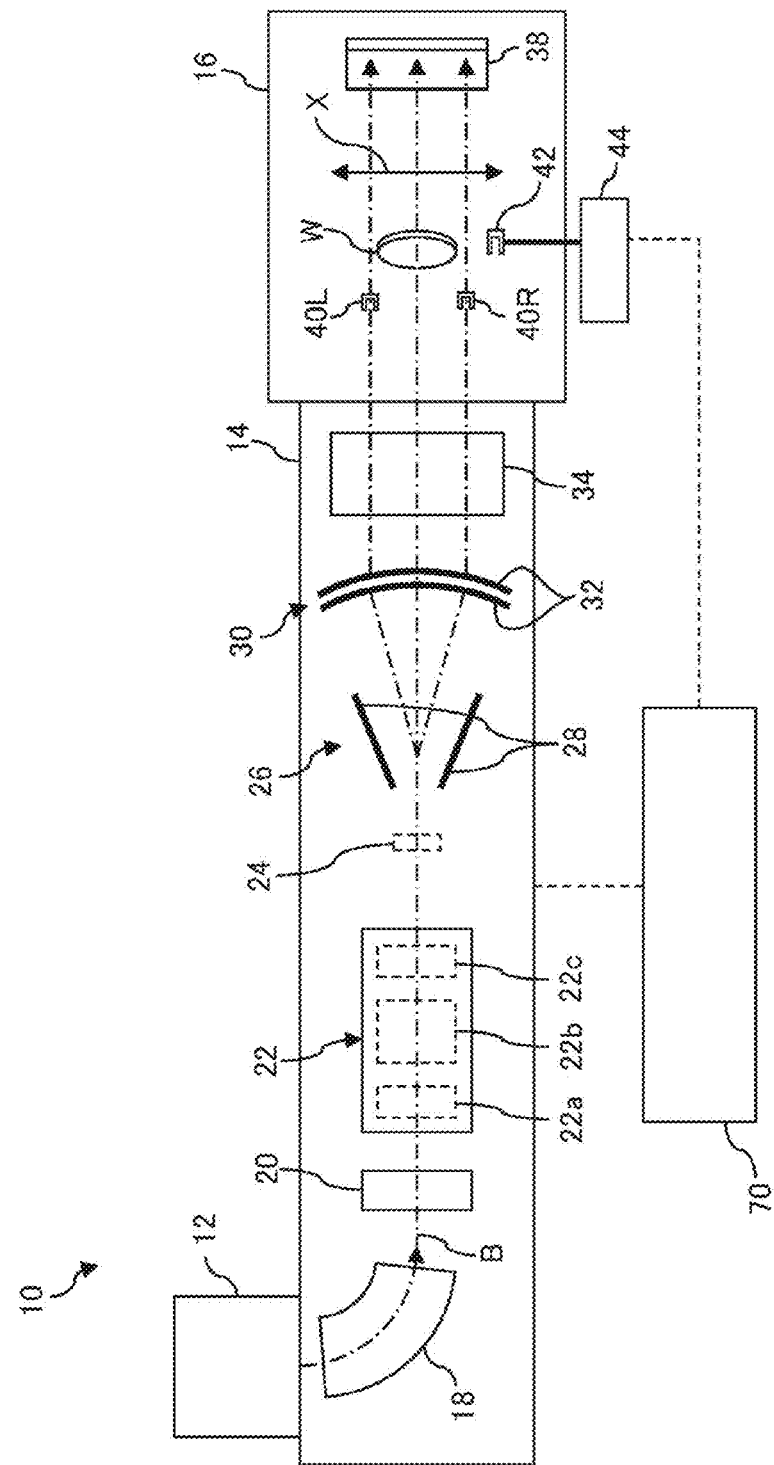
FIG. 1 is a top view schematically showing the configuration of an ion implantation apparatus according to an embodiment.

As an angle characteristic of the ion beam which is incident on the wafer, an incident angle as an average value of the entire beam (the center of gravity of an angle distribution) is given. In general, in order to improve the measurement accuracy of the center of gravity of the angle distribution of the beam, it is necessary to arrange a plurality of beam detectors in a direction in which an angular component of the beam is intended to be measured and to narrow the disposition interval of the beam detectors to increase the number of installed beam detectors. However, if a detection range of a single beam detector is narrowed by increasing the number of installed beam detectors, it takes time to acquire highly-reliable measurement data and the cost of a detection apparatus increases.

It is desirable to provide a technique for accurately measuring the center of gravity of an angle distribution of an ion beam.

Arbitrary combinations of the above constituent elements, or mutual substitutions of constituent elements or equations of the present invention between methods, apparatuses, systems, or the like are also effective as aspects of the present invention.

According to the present invention, it is possible to accurately measure the center of gravity of an angle distribution of an ion beam.

Hereinafter, a mode for carrying out the present invention will be described in detail with reference to the drawings. In the description of the drawings, the same elements are denoted by the same reference numerals and duplicate description is omitted as appropriate. Further, the configurations which are described below are exemplification and do not limit the scope of the present invention.

Figure 2:
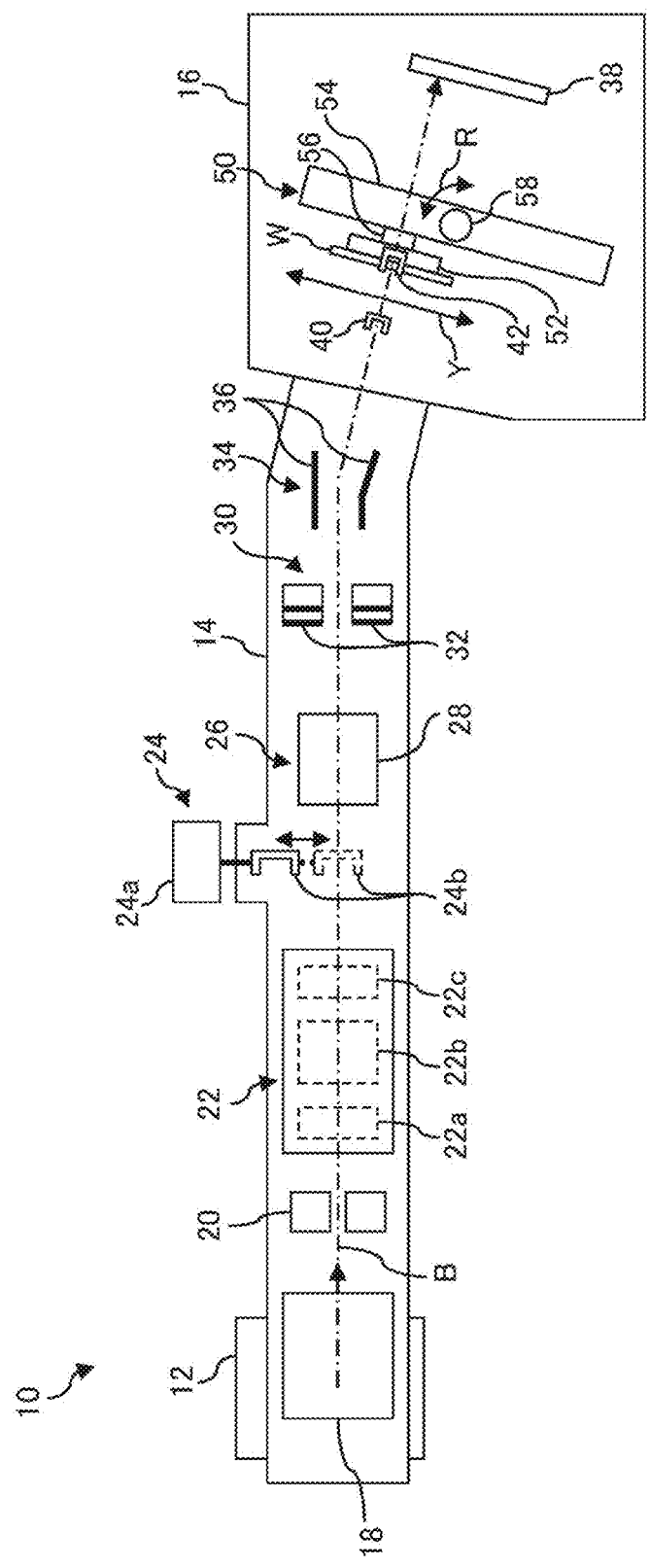
FIG. 2 is a side view schematically showing the configuration of the ion implantation apparatus of FIG. 1.

FIG. 1 is a top view schematically showing an ion implantation apparatus 10 according to an embodiment, and FIG. 2 is a side view showing a schematic configuration of the ion implantation apparatus 10.

The ion implantation apparatus 10 is configured so as to perform ion implantation process on the surface of a workpiece W. The workpiece W is, for example, a substrate and is, for example, a semiconductor wafer. Accordingly, in the following, for convenience of description, the workpiece W is sometimes referred to as a wafer W. However, this is not intended to limit an implantation process target to a specific object.

The ion implantation apparatus 10 is configured so as to irradiate the whole of the wafer W with an ion beam B by performing reciprocating scanning with the beam in one direction and reciprocating the wafer W in a direction orthogonal to the one direction. In this specification, for convenience of description, a traveling direction of the ion beam B traveling along a designed beam trajectory is defined as a z direction and a plane perpendicular to the z direction is defined as an x-y plane. In a case of scanning the workpiece W with the ion beam B, a scanning direction of the beam is set to be an x direction and a direction perpendicular to the z direction and the x direction is set to be a y direction. Accordingly, the reciprocating scanning of the beam is performed in the x direction and the reciprocating movement of the wafer W is performed in the y direction.

The ion implantation apparatus 10 is provided with an ion source 12, a beamline device 14, an implantation process chamber 16, and a controller 70. The ion source 12 is configured so as to provide the ion beam B to the beamline device 14. The beamline device 14 is configured so as to transport ions from the ion source 12 to the implantation process chamber 16. Further, the ion implantation apparatus 10 is provided with an evacuating system (not shown) for providing a desired vacuum environment to the ion source 12, the beamline device 14, and the implantation process chamber 16.

The beamline device 14 is provided with, for example, a mass analyzing unit 18, a variable aperture 20, a beam focusing unit 22, a first beam measuring instrument 24, a beam scanner 26, a parallelizing lens 30 or a beam parallelizing device, and an angular energy filter (AEF) 34 in order from the upstream. The upstream of the beamline device 14 indicates the side close to the ion source 12, and the downstream indicates the side close to the implantation process chamber 16 (or a beam stopper 38).

The mass analyzing unit 18 is provided downstream of the ion source 12 and is configured so as to select necessary ion species from the ion beam B extracted from the ion source 12, by mass analysis.

The variable aperture 20 is an aperture having an adjustable aperture width, and a beam current of the ion beam B passing through the aperture is adjusted by changing the aperture width. The variable aperture 20 may have, for example, aperture plates which are disposed upside and downside with a beam trajectory interposed therebetween, and the beam current may be adjusted by changing the gap between the aperture plates.

The beam focusing unit 22 is provided with a focusing lens such as a quadrupole focusing unit (a Q-lens) and is configured so as to shape the ion beam B having passed through the variable aperture 20 into a desired sectional shape. The beam focusing unit 22 is an electric field type triple quadrupole lens (also referred to as a triplet Q-lens) and has a first quadrupole lens 22a, a second quadrupole lens 22b, and a third quadrupole lens 22c in order from the upstream side. The beam focusing unit 22 can adjust convergence or divergence in the x and y directions of the ion beam B incident on the wafer W independently with respect to each direction by using the three lens devices 22a, 22b, and 22c. The beam focusing unit 22 may include a magnetic field type lens device and may include a lens device for shaping a beam by using both the electric field and the magnetic field.

The first beam measuring instrument 24 is an injector flag Faraday cup which is disposed so as to be movable onto and out of the beam trajectory and measures a beam current of the ion beam. The first beam measuring instrument 24 is configured so as to be able to measure the beam current of the ion beam B shaped by the beam focusing unit 22. The first beam measuring instrument 24 has a Faraday cup 24b for measuring the beam current, and a driving unit 24a for moving the Faraday cup 24b up and down. In a case where the Faraday cup 24b is disposed on the beam trajectory, as shown by a broken line in FIG. 2, the ion beam B is interrupted by the Faraday cup 24b. On the other hand, in a case where the Faraday cup 24b is removed from the beamline, as shown by a solid line in FIG. 2, the interruption of the ion beam B is canceled.

The beam scanner 26 is configured so as to provide the reciprocating scanning of the ion beam and is deflection means for performing the scanning of the shaped ion beam B in the x direction. The beam scanner 26 has a scanning electrode pair 28 in which scanning electrodes are provided to face each other in the x direction. The scanning electrode pair 28 is connected to a variable voltage power supply (not shown), and the ion beam B is deflected at various angles by changing an electric field which is generated between the electrodes, by periodically changing the voltage which is applied to the scanning electrode pair 28. In this way, the scanning of the ion beam B over a scanning range in the x direction is performed. In FIG. 1, the scanning direction and the scanning range of the beam are illustrated by an arrow X, and a plurality of trajectories of the ion beam B in the scanning range are shown by a one-dot chain line.

The parallelizing lens 30 is configured so as to make the traveling direction of the scanning ion beam B parallel to the designed beam trajectory. The parallelizing lens 30 has a plurality of arc-shaped P-lens electrodes 32 in which a passing slit for the ion beam is provided in the central portion. The P-lens electrodes 32 are connected to a high-voltage power supply (not shown) and makes an electric field generated by voltage application act on the ion beam B, thereby making the traveling direction of the ion beam B parallel. The parallelizing lens 30 may be replaced with another beam parallelizing device, and the beam parallelizing device may be configured as a magnetic device utilizing a magnetic field. An acceleration/deceleration (AD) column (not shown) for accelerating or decelerating the ion beam B may be provided downstream of the parallelizing lens 30.

The angular energy filter (AEF) 34 is configured so as to analyze the energy of the ion beam B and deflects ions having necessary energy downward to lead the ions to the implantation process chamber 16. The angular energy filter 34 has an AEF electrode pair 36 for a deflection by an electric field. The AEF electrode pair 36 is connected to a high-voltage power supply (not shown). In FIG. 2, the ion beam B is deflected downward by applying a positive voltage to an upper AEF electrode and a negative voltage to a lower AEF electrode. The angular energy filter 34 may be configured with a magnetic device for a deflection by a magnetic field and may be configured with a combination of an electrode pair for a deflection by an electric field and a magnetic device.

In this way, the beamline device 14 supplies the ion beam B with which the wafer W is to be irradiated, to the implantation process chamber 16.

The implantation process chamber 16 is provided with a platen driving device 50 which holds one or a plurality of wafers W, as shown in FIG. 2. The platen driving device 50 includes a wafer holding unit 52, a reciprocating mechanism 54, a twist angle adjusting mechanism 56, and a tilt angle adjusting mechanism 58. The wafer holding unit 52 is provided with an electrostatic chuck or the like for holding the wafer W. The reciprocating mechanism 54 reciprocates the wafer holding unit 52 in a reciprocating direction (the y direction) orthogonal to the beam scanning direction (the x direction), thereby reciprocating the wafer held by the wafer holding unit 52 in the y direction. In FIG. 2, the reciprocating movement of the wafer W is illustrated by an arrow Y.

The twist angle adjusting mechanism 56 is a mechanism for adjusting the rotation angle of the wafer W and rotates the wafer W with a line normal to a wafer processing surface as an axis, thereby adjusting a twist angle between an alignment mark provided in an outer circumferential portion of the wafer and a reference position. Here, the alignment mark of the wafer indicates a notch or an orientation flat which is provided in the outer circumferential portion of the wafer, and indicates a mark that serves as a reference for a crystal axis direction of the wafer or for an angular position in the circumferential direction of the wafer. The twist angle adjusting mechanism 56 is provided between the wafer holding unit 52 and the reciprocating mechanism 54, as shown in the drawing, and is reciprocated together with the wafer holding unit 52.

The tilt angle adjusting mechanism 58 is a mechanism for adjusting the inclination of the wafer W and adjusts a tilt angle between the traveling direction of the ion beam B heading for the wafer processing surface and the line normal to the wafer processing surface. In this embodiment, among the tilt angles of the wafer W, the angle with the axis in the x direction as the central axis of rotation is adjusted as the tilt angle. The tilt angle adjusting mechanism 58 is provided between the reciprocating mechanism 54 and the wall of the implantation process chamber 16 and is configured so as to adjust the tilt angle of the wafer W by rotating the whole of the platen driving device 50 which includes the reciprocating mechanism 54 in an R direction.

The implantation process chamber 16 is provided with the beam stopper 38. In a case where the wafer W does not exist on the beam trajectory, the ion beam B is incident on the beam stopper 38. Further, a second beam measuring instrument 44 for measuring the beam current of the ion beam and/or a beam current density distribution is provided at the implantation process chamber 16. The second beam measuring instrument 44 has side cups 40R and 40L and a center cup 42.

The side cups 40R and 40L are disposed to deviate from the wafer W in the x direction and disposed at positions where the ion beam heading for the wafer W during the ion implantation is not interrupted. The ion beam B performs over-scanning beyond the range in which the wafer W is located, and therefore, also during the ion implantation, a part of the beam which performs scanning is incident on the side cups 40R and 40L. In this way, the beam current during the ion implantation process is measured. The measurement values of the side cups 40R and 40L are sent to the second beam measuring instrument 44.

The center cup 42 is for measuring the beam current and/or the beam current density distribution on the surface of the wafer W (the wafer processing surface). The center cup 42 is of a movable type and is retracted from the wafer position during the ion implantation and inserted in the wafer position when the wafer W is not present at the irradiation position. The center cup 42 measures the beam current while moving in the x direction and measures the beam current density distribution in the beam scanning direction. The measurement value of the center cup 42 is sent to the second beam measuring instrument 44. The center cup 42 may be formed as an array in which a plurality of Faraday cups are arranged in the x direction such that the ion irradiation amounts at a plurality of positions in the beam scanning direction can be measured simultaneously.

The controller 70 controls the operation of each device configuring the ion implantation apparatus 10. The controller 70 acquires information on the intensity and/or the angular component of the beam measured by the second beam measuring instrument 44 and calculates the angle distribution and/or the center of gravity of an angle distribution of the ion beam. The controller 70 controls the operations of the beam focusing unit 22 and the like, based on the calculated angle information of the ion beam, thereby making the wafer W be irradiated with the ion beam having a desired angle distribution. The function of calculating the angle distribution and/or the center of gravity of an angle distribution of the ion beam may be provided in the second beam measuring instrument 44, instead of the controller 70.

Figure 3:
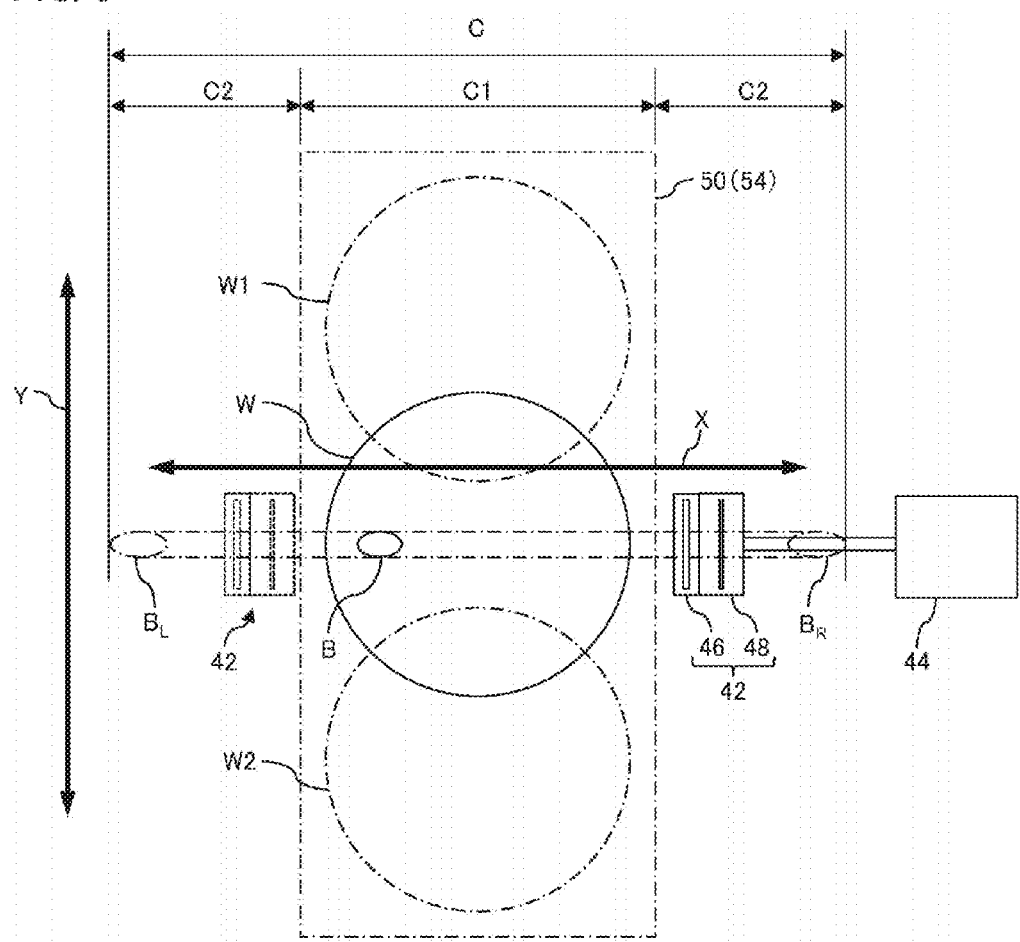
FIG. 3 is a front view showing the relationship between a wafer that reciprocates and an ion beam that performs reciprocating scanning.

FIG. 3 is a front view showing the relationship between the wafer W that reciprocates and the ion beam B that performs the reciprocating scanning. In FIG. 3, the ion beam B performs the reciprocating scanning in a lateral direction (the X direction), and the wafer W is held by the reciprocating mechanism 54 and reciprocated in a longitudinal direction (the Y direction). In FIG. 3, the moving range of the reciprocating mechanism 54 is shown by a wafer W1 which is at the uppermost position and a wafer W2 which is at the lowermost position.

Further, a scanning range C of the ion beam is shown by the positions of ion beams $B_L$ and $B_R$ which are at scanning end positions with respect to the ion beam B which performs scanning by the beam scanner. The ion beam B is controlled so as to be able to perform over-scanning to a non-irradiation range C2 in which the wafer W is not irradiated with the beam, beyond an irradiation range C1 in which the wafer W held by the platen driving device 50 is disposed. In FIG. 3, a state where the ion beam B which is laterally wide performs scanning is shown. However, the shape of the ion beam B may be longitudinally large or may be a shape close to a circular shape.

FIG. 3 shows the measurement range of the center cup 42 which is configured to be movable in the X direction. The center cup 42 is configured so as to be measurable over at least the irradiation range C1. The center cup 42 may include an intensity measurement device 46 and an angle measurement device 48, as shown in the drawing. The intensity measurement device 46 is a measurement device for measuring mainly the intensity of the ion beam B and is configured of, for example, a Faraday cup. The angle measurement device 48 is a measurement device for measuring mainly the angle distribution of the ion beam B. The details of the angle measurement device 48 will be separately described later. The intensity measurement device 46 and the angle measurement device 48 are disposed such that the measurement positions of both the measurement devices in the z direction are at the same position as the irradiated surface of the wafer W.

In this embodiment, a configuration is made such that the intensity and the angle distribution of the ion beam B can be simultaneously measured over the irradiation range C1 by disposing side by side the intensity measurement device 46 and the angle measurement device 48 and moving the intensity measurement device 46 and the angle measurement device 48 in the x direction by a driving device which is provided in the second beam measuring instrument 44. The second beam measuring instrument 44 moves the intensity measurement device 46 and the angle measurement device 48 over a period of a few seconds, preferably, a period in a range of about 1 to 2 seconds, from one end to the other end of the irradiation range C1. In this way, it is possible to measure the intensity and the angle distribution of the beam over the entire irradiation range C1 within a few seconds. As a modified example, a configuration may be made in which the intensity measurement device 46 is not provided and the angle measurement device 48 measures the beam intensity as well.

Figure 4:
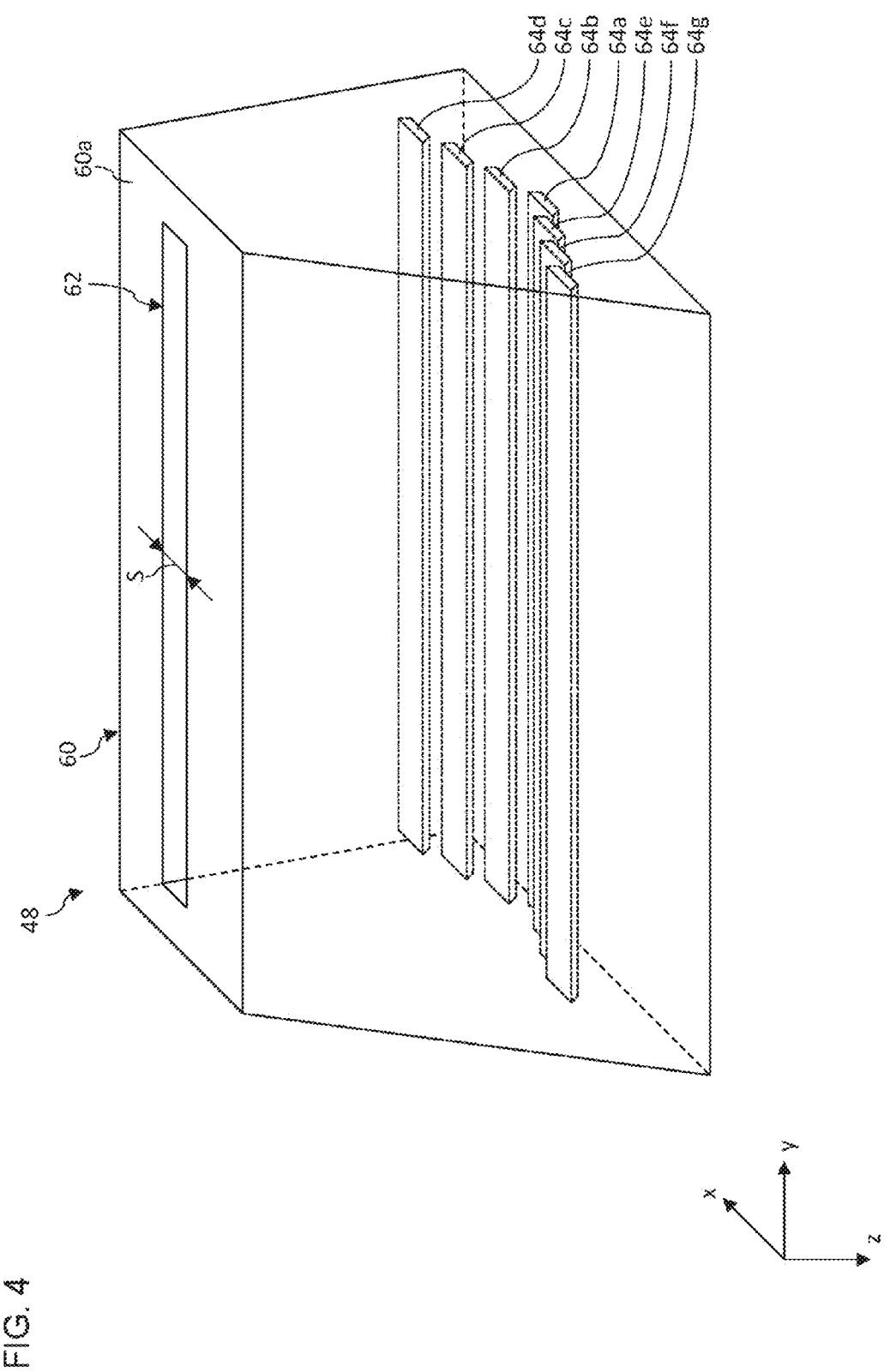
FIG. 4 is a perspective view schematically showing the configuration of an angle measurement device according to an embodiment.
Figure 5:
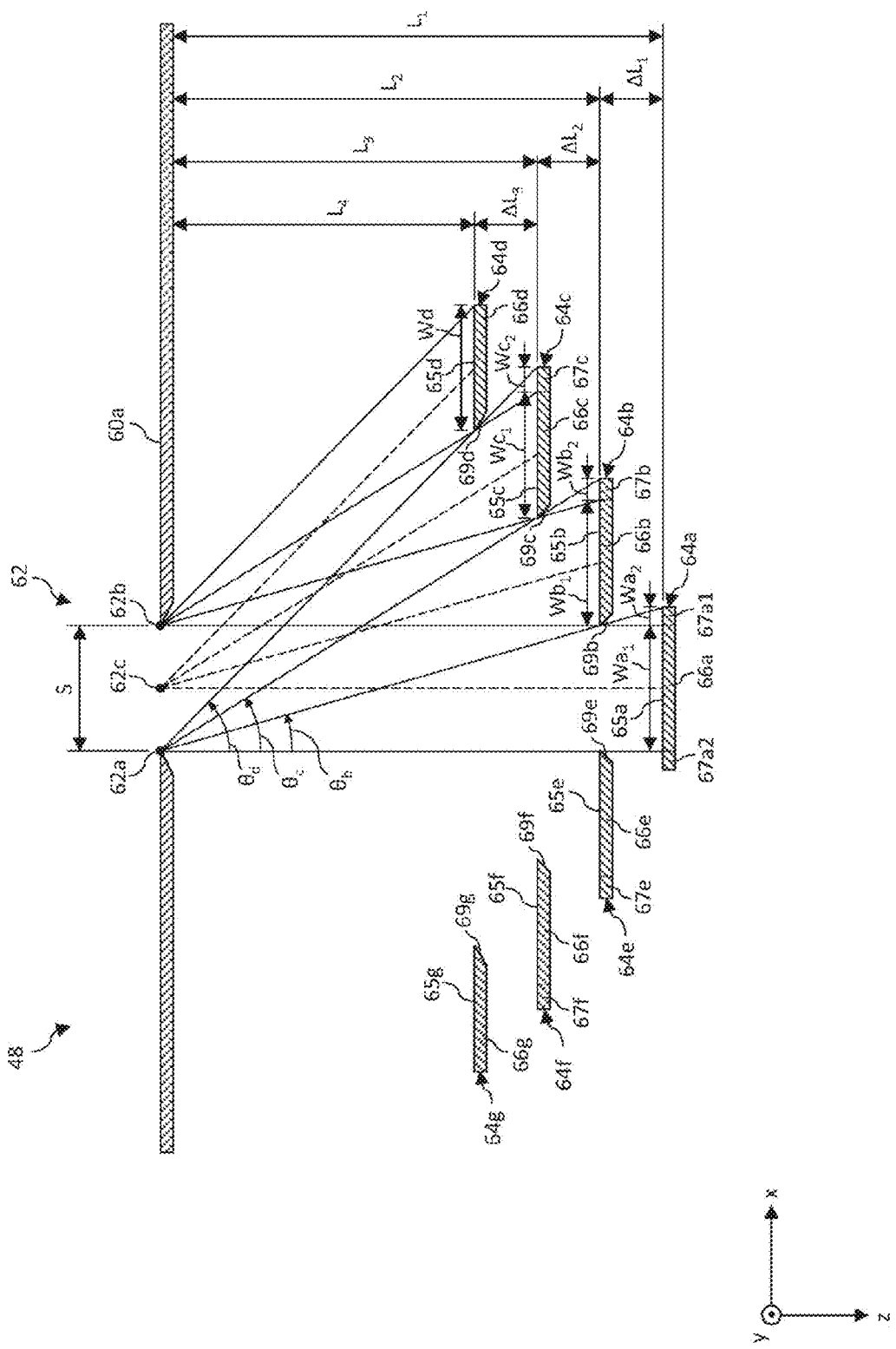
FIG. 5 is a sectional view schematically showing the configuration of the angle measurement device of FIG. 4.

FIG. 4 is a perspective view showing a schematic configuration of the angle measurement device 48, and FIG. 5 is a sectional view showing the schematic configuration of the angle measurement device 48. The angle measurement device 48 has a case 60, a slit 62, and a plurality of electrode bodies 64a, 64b, 64c, 64d, 64e, 64f, and 64g (hereinafter also collectively referred to as an electrode body 64). The angle measurement device 48 is configured so as to detect an angular component θx in the scanning direction (the x direction) with respect to the beam traveling direction (the z direction) with regard to the ion beam passing through the slit 62.

The slit 62 is provided in an upper surface 60a of the case 60. The slit 62 is formed such that a slit width direction (a short side direction) is in the x direction, and has a rectangular shape elongated in the y direction. The slit 62 is formed such that a slit width S is constant in the y direction. The slit 62 is formed such that the slit width S is smaller than the beam diameter in the x direction of the ion beam, and thus a portion to be measured is separated from the beam having a predetermined size. It is desirable that the slit 62 has a tapered shape extending in the slit width direction (the x direction) toward the beam traveling direction (a +z direction) so as not to interrupt ions which are obliquely incident toward the electrode body 64 from the slit 62. On the other hand, the length in the y direction of the slit 62 is formed so as to be larger than the beam diameter in the y direction of the ion beam, and thus the whole of the ion beam in the y direction becomes a measurement target.

The electrode body 64 has a shape elongated in the y direction and is provided away from the upper surface 60a, in which the slit 62 is provided, in the z direction. It is desirable that the electrode body 64 is provided to be longer than the slit 62 in the y direction so as to be able to detect the whole of the ion beam having passed through the slit 62. In this embodiment, seven electrode bodies 64 are provided, and three electrode bodies 64 are disposed on each of the right and left sides with a first electrode body 64a provided at a position facing the slit 62 as the center. A second electrode body 64b, a third electrode body 64c, and a fourth electrode body 64d are disposed in order in a +x direction from the first electrode body 64a, and a fifth electrode body 64e, a sixth electrode body 64f, and a seventh electrode body 64g are disposed in order in a −x direction from the first electrode body 64a. In the illustrated example, the electrode bodies 64a to 64g are disposed to be symmetric (that is, bilaterally symmetric on the plane of FIG. 5) in the slit width direction with the position of the slit 62 as the center.

The plurality of electrode bodies 64a to 64g respectively have beam measurement surfaces 65a, 65b, 65c, 65d, 65e, 65f, and 65g (also collectively referred to as a beam measurement surface 65), each of which is a region that is exposed to the ion beam having passed through the slit 62. The plurality of electrode bodies 64a to 64g are disposed such that the beam measurement surfaces 65a to 65g of the electrode bodies are arranged in order in the slit width direction (the x direction) and the beam measurement surfaces 65 adjacent to each other in the x direction deviate from each other in the beam traveling direction (the z direction). In the illustrated example, the first electrode body 64a is disposed at a position farthest from the slit 62 in the beam traveling direction, and the second electrode body 64b, the third electrode body 64c, and the fourth electrode body 64d are disposed in this order on the front side in the beam traveling direction. Similarly, the fifth electrode body 64e, the sixth electrode body 64f, and the seventh electrode body 64g are disposed in this order on the front side in the beam traveling direction. Therefore, the beam measurement surfaces 65a to 65g of the electrode bodies are disposed so as to be arranged in a V shape when viewed in a cross section in an x-z plane shown in FIG. 5. Further, the beam measurement surfaces 65a to 65g of the electrode bodies are disposed so as to be arranged in the slit width direction without gaps therebetween, as seen from the ion beam passing through the slit 62.

Each of the plurality of electrode bodies 64a to 64g is disposed so as to measure beam components corresponding to a predetermined angular range which is set to a different value for each electrode body, with respect to the ion beam having passed through the slit 62. The first electrode body 64a measures beam components in a predetermined range with a first angle $\theta_a=0$ as a central angle value. The second electrode body 64b measures beam components in a predetermined range with a second angle $\theta_b$ as a central angle value, the third electrode body 64c measures beam components in a predetermined range with a third angle $\theta_c$ as a central angle value, and the fourth electrode body 64d measures beam components in a predetermined range with a fourth angle $\theta_d$ as a central angle value. Similarly, the fifth electrode body 64e measures beam components in a predetermined range with a fifth angle $-\theta_b$ as a central angle value, the sixth electrode body 64f measures beam components in a predetermined range with a sixth angle $-\theta_c$ as a central angle value, and the seventh electrode body 64g measures beam components in a predetermined range with a seventh angle $-\theta_d$ as a central angle value.

The first electrode body 64a has a first portion 66a and second portions 67a1 and 67a2. The first portion 66a of the first electrode body 64a is provided at a position where an opening area of the slit 62 is moved parallel in a direction of the first angle $\theta_a=0$ (the z direction), and a length $Wa_1$ thereof in the slit width direction is the same as the slit width S. All the beam components having the first angle $\theta_a=0$, of the ion beam having passed through the slit 62, are incident on the first portion 66a of the first electrode body 64a. That is, on the first portion 66a of the first electrode body 64a, the beam component having the first angle $\theta_a=0$, which passes through a central portion 62c of the slit 62 in the slit width direction, is incident and the beam components having the first angle $\theta_a=0$, which pass through the vicinity of both ends 62a and 62b of the slit 62 in the slit width direction, are also incident. As a result, substantially all the beam components having the first angle $\theta_a=0$, of the ion beam having passed through the slit 62, are detected at the first electrode body 64a and not detected at the other electrode bodies.

The second portions 67a1 and 67a2 (also collectively referred to as a second portion 67a) of the first electrode body 64a are portions which are provided on the right side and the left side of the first portion 66a, and are portions overlapping the second electrode body 64b or the fifth electrode body 64e adjacent thereto, in the beam traveling direction. Since the second portion 67a of the first electrode body 64a is disposed on the back side of the electrode body adjacent thereto, the beam component having the first angle $\theta_a=0$ is not incident thereon. However, beam components having angles different from the first angle $\theta_a=0$ can be obliquely incident thereon. For example, a beam component having an angle close to the second angle $\theta_b$, which passes through the vicinity of the left end 62a of the slit 62, can be incident on the second portion 67a1 which is provided on the right side of the first portion 66a. Similarly, a beam component having an angle close to the fifth angle $-\theta_b$, which passes through the vicinity of the right end 62b of the slit 62, can be incident on the second portion 67a2 which is provided on the left side of the first portion 66a. In this manner, the second portions 67a are provided on the right and left sides of the first electrode body 64a, whereby the occurrence of a beam component passing through the gap between the first electrode body 64a and the electrode body adjacent thereto is prevented and a gap is not formed between the beam measurement surfaces adjacent to each other, as seen from the ion beam having passed through the slit 62.

A length $Wa_2$ in the slit width direction of the second portion 67a of the first electrode body 64a is expressed as an equation, $Wa_2=\Delta L_1 \cdot \tan(\theta_b)$, by using a deviation amount $\Delta L_1$ between the beam measurement surfaces of the first electrode body 64a and the second electrode body 64b and the second angle $\theta_b$ that is the central angle value of the second electrode body 64b. The deviation amount $\Delta L_1$ between the beam measurement surfaces is expressed as an equation, $\Delta L_1=L_1-L_2$, by using a distance $L_1$ from the slit 62 to the first beam measurement surface 65a in the z direction and a distance $L_2$ from the slit 62 to the second beam measurement surface 65b in the z direction. Further, the second angle $\theta_b$ is expressed as an equation, $\tan(\theta_b)=S/L_2$. Therefore, a total length Wa of the first electrode body 64a is $Wa=Wa_1+2Wa_2=S(2L_1-L_2)/L_2$. Therefore, the length Wa of the first beam measurement surface 65a in the slit width direction is longer than the slit width S. Due to configuring the first electrode body 64a in this manner, in the first beam measurement surface 65a, the beam components in the angular range from the fifth angle $-\theta_b$ to the second angle $\theta_b$ with the first angle $\theta_a=0$ as the central angle value are detected.

The second electrode body 64b has a first portion 66b and a second portion 67b and is disposed such that the position (the distance $L_2$) of the second beam measurement surface 65b in the beam traveling direction is the same as the point of intersection of a straight line extending in the direction of the second angle $\theta_b$ from the left end 62a of the slit 62 with a straight line extending in the direction of the first angle $\theta_a=0$ from the right end 62b of the slit 62. The first portion 66b of the second electrode body 64b is provided at a position where the opening area of the slit 62 is moved parallel in the direction of the second angle $\theta_b$, and a length $Wb_1$ thereof in the slit width direction is the same as the slit width S. All the beam components having the second angle $\theta_b$, of the ion beam having passed through the slit 62, are incident on the first portion 66b of the second electrode body 64b. That is, on the first portion 66b of the second electrode body 64b, the beam component having the second angle $\theta_b$, which passes through the central portion 62c of the slit 62 in the slit width direction, is incident and the beam components having the second angle $\theta_b$, which pass through the vicinity of both ends 62a and 62b of the slit 62 in the slit width direction, are also incident. As a result, substantially all the beam components having the second angle $\theta_b$, of the ion beam having passed through the slit 62, are detected at the second electrode body 64b and not detected at the other electrode bodies.

The second portion 67b of the second electrode body 64b is provided on the right side of the first portion 66b and overlaps the third electrode body 64c adjacent thereto, in the beam traveling direction. Since the second portion 67b of the second electrode body 64b is disposed on the back side of the third electrode body 64c, the beam component having the second angle $\theta_b$ is not incident thereon. However, beam components having angles different from the second angle $\theta_b$ can be obliquely incident thereon. For example, a beam component having an angle close to the third angle $\theta_c$, which passes through the vicinity of the left end 62a of the slit 62, can be incident on the second portion 67b of the second electrode body 64b. On the other hand, on the left side of the first portion 66b of the second electrode body 64b, the second portion is not provided and instead, a tapered portion 69b for preventing the beam component obliquely incident toward the second portion 67a1 of the first electrode body 64a from being interrupted is provided. In this manner, the tapered portion 69b is provided on the side (the left side) where the adjacent electrode body is located on the back side in the beam traveling direction, and the second portion 67b extending from the first portion 66b is provided on the side (the right side) where the adjacent electrode body is located on the front side in the beam traveling direction. Since the tapered portion 69b is provided, the second electrode body 64b has a shape in which the length thereof in the slit width direction decreases toward the beam traveling direction.

A length $Wb_2$ in the slit width direction of the second portion 67b of the second electrode body 64b is expressed as an equation, $Wb_2=\Delta L_2 \cdot \{\tan(\theta_c)-\tan(\theta_b)\}$, by using a deviation amount $\Delta L_2$ between the beam measurement surfaces of the second electrode body 64b and the third electrode body 64c, the second angle $\theta_b$ that is the central angle value of the second electrode body 64b, and the third angle $\theta_c$ that is the central angle value of the third electrode body 64c. The deviation amount $\Delta L_2$ between the beam measurement surfaces is expressed as an equation, $\Delta L_2=L_2-L_3$, by using the distance $L_2$ from the slit 62 to the second beam measurement surface 65b in the z direction and a distance $L_3$ from the slit 62 to the third beam measurement surface 65c in the z direction. Further, with respect to the third angle $\theta_c$, an equation, $\tan(\theta_c)-\tan(\theta_b)=S/L_3$, is expressed. Therefore, a total length Wb of the second electrode body 64b is $Wb=Wb_1+Wb_2=S \cdot L_2/L_3$, and the length of the second beam measurement surface 65b in the slit width direction is also longer than the slit width S. Due to configuring the second electrode body 64b in this manner, in the second beam measurement surface 65b, the beam components in the angular range from the first angle $\theta_a=0$ to the third angle $\theta_c$ with the second angle $\theta_b$ as the central angle value are detected.

The third electrode body 64c has a first portion 66c and a second portion 67c and is disposed such that the position (the distance $L_3$) of the third beam measurement surface 65c in the beam traveling direction is the same as the point of intersection of a straight line extending in the direction of the third angle $\theta_c$ from the left end 62a of the slit 62 with a straight line extending in the direction of the second angle $\theta_b$ from the right end 62b of the slit 62. The first portion 66c of the third electrode body 64c is provided at a position where the opening area of the slit 62 is moved parallel in the direction of the third angle $\theta_c$, and a length $Wc_1$ thereof in the slit width direction is the same as the slit width S. All the beam components having the third angle $\theta_c$, of the ion beam having passed through the slit 62, are incident on the first portion 66c of the third electrode body 64c. Substantially all the beam components having the third angle $\theta_c$, of the ion beam having passed through the slit 62, are detected at the third electrode body 64c and not detected at the other electrode bodies.

The second portion 67c of the third electrode body 64c is provided on the right side of the first portion 66c and overlaps the fourth electrode body 64d adjacent thereto, in the beam traveling direction. Since the second portion 67c of the third electrode body 64c is disposed on the back side of the fourth electrode body 64d, the beam component having the third angle $\theta_c$ is not incident thereon. However, beam components having angles different from the third angle $\theta_c$ can be obliquely incident thereon. A tapered portion 69c for preventing the beam component obliquely incident toward the second portion 67b of the second electrode body 64b from being interrupted is provided on the left side of the third electrode body 64c. Since the tapered portion 69c is provided, the third electrode body 64c has a shape in which the length thereof in the slit width direction decreases toward the beam traveling direction.

A length $Wc_2$ in the slit width direction of the second portion 67c of the third electrode body 64c is expressed as an equation, $Wc_2=\Delta L_3 \cdot \{\tan(\theta_d)-\tan(\theta_c)\}$, by using a deviation amount $\Delta L_3$ between the beam measurement surfaces of the third electrode body 64c and the fourth electrode body 64d, the third angle $\theta_c$ that is the central angle value of the third electrode body 64c, and the fourth angle $\theta_d$ that is the central angle value of the fourth electrode body 64d. The deviation amount $\Delta L_3$ between the beam measurement surfaces is expressed as an equation, $\Delta L_3=L_3-L_4$, by using the distance $L_3$ from the slit 62 to the third beam measurement surface 65c in the z direction and a distance $L_4$ from the slit 62 to the fourth beam measurement surface 65d in the z direction. Further, with respect to the fourth angle $\theta_d$, an equation, $\tan(\theta_d)-\tan(\theta_c)=S/L_4$, is expressed. Therefore, a total length Wc of the third electrode body 64c is $Wc=Wc_1+Wc_2=S \cdot L_3/L_4$, and the length of the third beam measurement surface 65c in the slit width direction is also longer than the slit width S. Due to configuring the third electrode body 64c in this manner, in the third beam measurement surface 65c, the beam components in the angular range from the second angle $\theta_b$ to the fourth angle $\theta_d$ with the third angle $\theta_c$ as the central angle value are detected.

The fourth electrode body 64d is disposed such that the position (the distance $L_4$) of the fourth beam measurement surface 65d in the beam traveling direction is the same as the point of intersection of a straight line extending in the direction of the fourth angle $\theta_d$ from the left end 62a of the slit 62 with a straight line extending in the direction of the third angle $\theta_c$ from the right end 62b of the slit 62. The fourth electrode body 64d is provided at a position where the opening area of the slit 62 is moved parallel in the direction of the fourth angle $\theta_d$, and a length Wd thereof in the slit width direction is the same as the slit width S. All the beam components having the fourth angle $\theta_d$, of the ion beam having passed through the slit 62, are incident on the fourth electrode body 64d. Substantially all the beam components having the fourth angle $\theta_d$, of the ion beam having passed through the slit 62, are detected at the fourth electrode body 64d and not detected at the other electrode bodies.

The fourth electrode body 64d has a first portion 66d but does not have a second portion like those of other electrode bodies. This is because the fourth electrode body 64d is disposed in front of the third electrode body 64c adjacent thereto, in the beam traveling direction, and on the other hand, any adjacent electrode body is not provided in front of the fourth electrode body 64d. A tapered portion 69d for preventing the beam component obliquely incident toward the second portion 67c of the third electrode body 64c from being interrupted is provided on the left side of the fourth electrode body 64d. Since the tapered portion 69d is provided, the fourth electrode body 64d has a shape in which the length thereof in the slit width direction decreases toward the beam traveling direction. A length Wd of the fourth electrode body 64d in the slit width direction is the same as the slit width S of the slit 62. In the fourth beam measurement surface 65d of the fourth electrode body 64d, the beam components in an angular range exceeding the third angle $\theta_c$, with the fourth angle $\theta_d$ as the central angle value, are detected.

The fifth electrode body 64e has a shape symmetrical to the second electrode body 64b and is disposed at a position where it becomes bilaterally symmetrical to the second electrode body 64b. The fifth electrode body 64e has a first portion 66e and a second portion 67e which is provided on the left side of the first portion 66e. A tapered portion 69e for preventing the beam component incident on the second portion 67a2 of the first electrode body 64a from being interrupted is provided on the right side of the first portion 66e of the fifth electrode body 64e. In the fifth beam measurement surface 65e of the fifth electrode body 64e, the beam components in the angular range from the first angle $\theta_a=0$ to the sixth angle $-\theta_c$ with the fifth angle $-\theta_b$ as the central angle value are detected.

The sixth electrode body 64f has a shape symmetrical to the third electrode body 64c and is disposed at a position where it becomes bilaterally symmetrical to the third electrode body 64c. The sixth electrode body 64f has a first portion 66f and a second portion 67f which is provided on the left side of the first portion 66f. A tapered portion 69f for preventing the beam component incident on the second portion 67e of the fifth electrode body 64e from being interrupted is provided on the right side of the first portion 66f of the sixth electrode body 64f. In the sixth beam measurement surface 65f of the sixth electrode body 64f, the beam components in the angular range from the fifth angle $-\theta_b$ to the seventh angle $-\theta_d$ with the sixth angle $-\theta_c$ as the central angle value are detected.

The seventh electrode body 64g has a shape symmetrical to the fourth electrode body 64d and is disposed at a position where it becomes bilaterally symmetrical to the fourth electrode body 64d. The seventh electrode body 64g has a first portion 66g, and a tapered portion 69g for preventing the beam component incident on the second portion 67f of the sixth electrode body 64f from being interrupted is provided on the right side of the first portion 66g. In the seventh beam measurement surface 65g of the seventh electrode body 64g, the beam components in a range exceeding the sixth angle $-\theta_c$ in the absolute value, with the seventh angle $-\theta_d$ as the central angle value, are detected.

It is preferable that the respective electrode bodies 64 are disposed to deviate from each other in the beam traveling direction to the extent that electrical insulation between the electrode bodies adjacent to each other can be secured. On the other hand, it is preferable that the deviation amount ΔL (ΔL1, ΔL2, or ΔL3) between the electrode bodies adjacent to each other is reduced to a certain extent such that the angle measurement device 48 can be downsized. Specifically, the deviation amount ΔL between the electrode bodies adjacent to each other may be larger than the thickness of each electrode body 64 in the beam traveling direction and may be smaller than the length W (Wa, Wb, Wc, or Wd) of the beam measurement surface of each electrode body 64 in the slit width direction. In this embodiment, for any of the electrode bodies, a pair of electrode bodies adjacent to each other are disposed so as to overlap each other in the beam traveling direction.

The angle measurement device 48 has a measurement circuit which is connected to each of the plurality of electrode bodies 64a to 64g. The measurement circuit measures a current which is generated due to the incidence of ions on each electrode body 64, and measures the angle distribution of the ion beam B incident on the slit 62 using the current value from each of the plurality of electrode bodies 64a to 64g. Further, the measurement circuit has a function of detecting a time change of the current from the electrode body 64 over a predetermined measurement period. In this way, it is possible to measure the time change of the angle distribution relating to the ion beam B incident on the slit 62. The measurement circuit may have a function of detecting the integrated intensity of the angle distribution of the beam by integrating the current from the electrode body 64 over a measurement period.

Figure 6A:
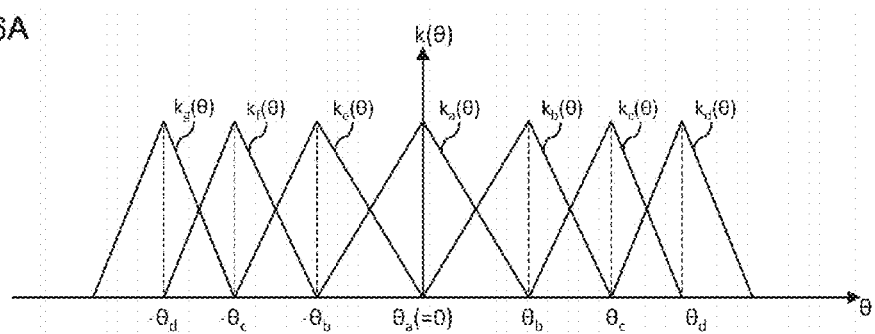
FIGS. 6A and 6B are graphs schematically showing an angle characteristic of the angle measurement device.
Figure 6B:
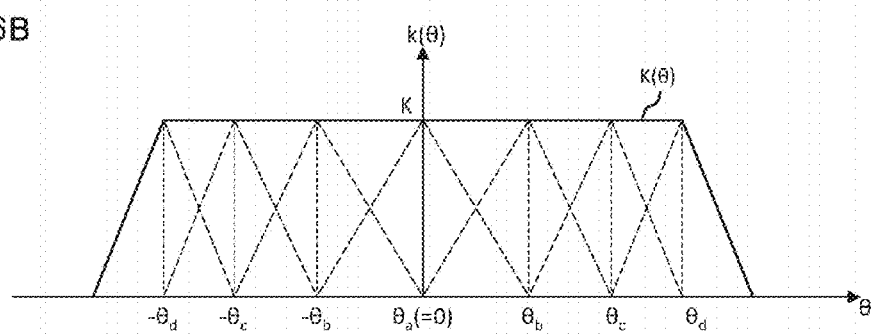

FIGS. 6A and 6B are graphs schematically showing the angle characteristic of the angle measurement device 48. FIG. 6A shows an angle sensitivity coefficient k(θ) of each of the electrode bodies 64a to 64g, and FIG. 6B shows an angle sensitivity coefficient K(θ) of the angle measurement device 48 as the whole. Here, the angle sensitivity coefficient K(θ) of the angle measurement device 48 as the whole is defined as an equation, K(θ)=I'(θ)/I(θ), by using intensity I(θ) of the entirety of beam components having an angle θ of the ion beam passing through the slit 62, and measured intensity I'(θ) of the beam component having the angle θ, which is measured by the angle measurement device 48. Further, an angle sensitivity coefficient $k_i(\theta)$ (i=a to g) of each of the electrode bodies 64a to 64g is defined as an equation, $k_i(\theta)=I_i'(\theta)/I(\theta)$, by using measured intensity $I_i'(\theta)$ of the beam component having the angle θ, which is measured on each electrode body 64i. The angle sensitivity coefficient K(θ) of the angle measurement device 48 is expressed as an equation, $K(\theta)=\Sigma k_i(\theta)$.

The angle sensitivity coefficient $k_i(\theta)$ of each of the electrode bodies 64a to 64g is represented by a triangular graph, as shown in FIG. 6A, and includes a range linearly increasing with respect to the angle θ and a range linearly decreasing with respect to the angle θ. For example, the angle sensitivity coefficient $k_a(\theta)$ of the first electrode body 64a linearly increases toward the first angle $\theta_a=0$ from the fifth angle $-\theta_b$, becomes the maximum at the first angle $\theta_a$ that is the central angle value, and linearly decreases toward the second angle $\theta_b$ from the first angle $\theta_a$. The other electrode bodies also have similar angle sensitivity coefficients. Generally describing, if the central angle value of an i-th electrode body is set to be $\theta_i$ and the central angle values of the left and right electrode bodies adjacent to the i-th electrode body are set to be $\theta_{i-1}$ and $\theta_{i+1}$, the angle sensitivity coefficient $k_i(\theta)$ of the i-th electrode body becomes zero at the central angle values $\theta_{i-1}$ and $\theta_{i+1}$ of the electrode bodies adjacent thereto, and linearly increases toward the central angle value $\theta_i$ of the i-th electrode body to become the maximum at the central angle value $\theta_i$.

Figure 7:
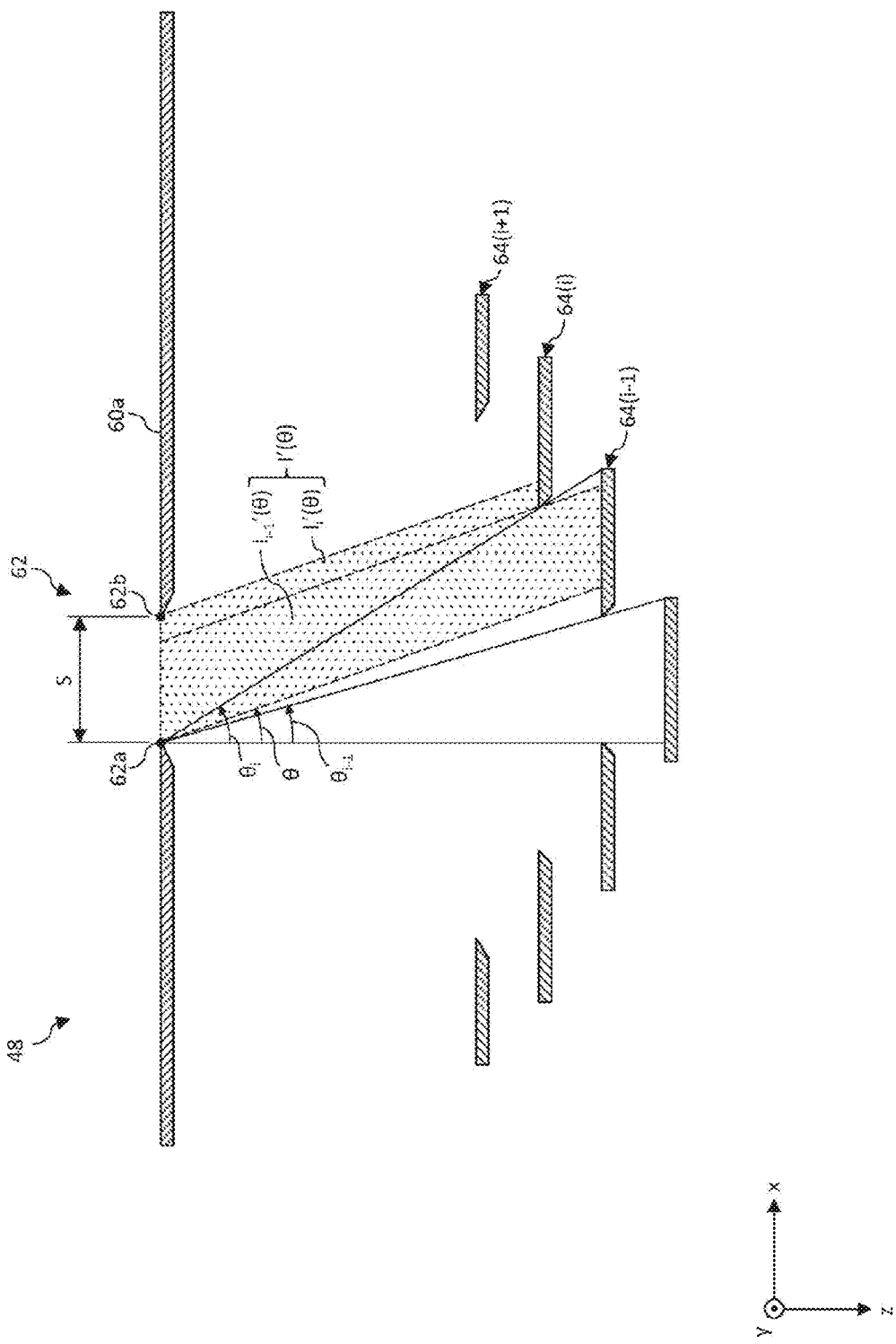
FIG. 7 is a diagram schematically showing beam components which are measured at (i−1)-th and i-th electrode bodies.

FIG. 7 is a diagram schematically showing measured intensities $I_{i-1}'(\theta)$ and $I_i'(\theta)$ of the beam components having the angle θ, which are measured at the (i−1)-th and i-th electrode bodies, 64(i−1) and 64(i). In the illustrated example, a case where the angle θ satisfies the relationship of $\theta_{i-1}<\theta<\theta_i$ is shown, and some of the beam components having the angle θ are incident on the i-th electrode body 64(i), and the rest are incident on the (i−1)-th electrode body 64(i−1) adjacent thereto. In this case, the measurement intensities of the i-th electrode body 64(i) and the (i−1)-th electrode body 64(i−1) adjacent thereto can be respectively expressed by the following equations (1) and (2). I'(θ) which is included in the right side is the sum of measured intensities which are measured at a pair of electrode bodies 64(i) and 64(i−1) adjacent to each other. Here, with respect to the angle θ, an approximating relationship of tan θ≈θ is used.

$$I_i'(\theta) = \frac{\theta - \theta_{i-1}}{\theta_i - \theta_{i-1}} I'(\theta) \tag{1}$$

$$I_{i-1}'(\theta) = \frac{\theta_i - \theta}{\theta_i - \theta_{i-1}} I'(\theta) \tag{2}$$

The above equations (1) and (2) mean that if the angle θ of the beam component to be measured approaches the central angle value $\theta_i$ of the i-th electrode body, a proportion which is measured at the i-th electrode body 64(i) increases, and on the other hand, if the angle θ approaches the central angle value $\theta_{i-1}$ of the (i−1)-th electrode body, a proportion which is measured at the i-th electrode body 64(i) decreases. Further, the equations mean that the measured intensity $I_i'(\theta)$ of the beam component which is measured at the i-th electrode body 64(i) is represented by a linear function (or can be approximated by a linear function) of the angle θ of the beam component to be measured.

In this case, the beam component having the angle θ is measured by either one of the electrode bodies adjacent to each other, and therefore, the total value I'(θ) of the measurement intensities of the electrode bodies adjacent to each other and the intensity I(θ) of the entire ion beam having passed through the slit 62 coincide with each other. As a result, the angle sensitivity coefficient K(θ) of the angle measurement device 48 as a whole has a constant value in a predetermined angular range $[-\theta_d$ to $\theta_d]$, as shown in FIG. 6B. That is, the angle measurement device 48 measures the ion beam with a constant sensitivity with respect to the angle θ in the angular range to be measured.

Next, a method of calculating the center of gravity of an angle distribution of the ion beam using the measurement results from the angle measurement device 48 will be described. In a case where a continuous intensity distribution I(θ) with respect to the angle θ is known about the ion beam passing through the slit 62, a center of gravity of an angle distribution $\theta_G$ of the ion beam is expressed by the following equation (3).

$$\theta_G = \frac{\int \theta I(\theta) d\theta}{\int I(\theta) d\theta} \quad (3)$$

However, in practice, it is difficult to measure the continuous intensity distribution I(θ) with respect to the angle θ of the ion beam, and the center of gravity of an angle distribution $\theta_G$ of the ion beam is estimated from data obtained by discretizing the above equation (3). That is, as in the angle measurement device 48 shown in FIG. 7, a plurality of electrode bodies 64(i) having different angles $\theta_i$ to be measured are disposed, and a center of gravity of an angle distribution $\theta_G'$ which is obtained by actual measurement is calculated by using an integrated intensity $I_i'$ of the beam component which is measured at each electrode body 64(i). The center of gravity of an angle distribution $\theta_G'$ which is obtained by the measurement is expressed by the following equation (4). The angle $\theta_i$ corresponds to the central angle value of the beam component which is measured at each electrode body 64(i).

$$\theta_G' = \frac{\sum_i \theta_i I_i'}{\sum_i I_i'} \quad (4)$$

Here, if the right side of the equation (3) and the right side of the equation (4) coincide with each other, the center of gravity of an angle distribution $\theta_G'$ which is obtained by the measurement and the actual center of gravity of an angle distribution $\theta_G$ of the ion beam coincide with each other, and thus an accurate center of gravity of an angle distribution can be measured. Hereinafter, the accuracy of the center of gravity of an angle distribution $\theta_G'$ which is obtained by the angle measurement device 48 will be described by comparing the center of gravity of an angle distribution $\theta_G'$ which is obtained by measurement using the angle measurement device 48 with the actual center of gravity of an angle distribution $\theta_G$.

First, the integrated intensity $I_i'$ which is measured by each electrode body 64(i) is considered. The integrated intensity $I_i'$ of each electrode body 64(i) is expressed by the following equation (5) using the angle sensitivity coefficient $k_i(\theta)$ described above. The equation (5) means that if the product of the angular intensity distribution I(θ) of the ion beam having passed through the slit 62 and the angle sensitivity coefficient $k_i(\theta)$ of the electrode body 64 (i) is integrated in the angular range $[\theta_{i-1}$ to $\theta_{i+1}]$ to be measured, the integrated intensity $I_i'$ of the electrode body 64(i) is obtained. The measurement result which is actually obtained by each electrode body 64(i) is the integrated intensity $I_i'$ integrated over the angle range that each beam measurement surface receives, and the measured intensity I'(θ) of the beam component corresponding to a specific angle θ cannot be obtained for each angle.

$$I_i' = \int_{\theta_{i-1}}^{\theta_{i+1}} k_i(\theta) I(\theta) d\theta \quad (5)$$

Using the above equation (5), the denominator of the equation (4) can be transformed like the following equation (6). This is because the angle sensitivity coefficient K(θ) becomes a constant value K in the angle measurement range $[-\theta_d$ to $\theta_d]$ of the angle measurement device 48. Therefore, the denominator of the equation (4) becomes a value obtained by multiplying the denominator of the equation (3) by K in the angle measurement range $[-\theta_d$ to $\theta_d]$ of the angle measurement device 48.

$$\sum_i I_i' = \sum_i \int_{\theta_{i-1}}^{\theta_{i+1}} k_i(\theta) I(\theta) d\theta \quad (6)$$

$$= \int \sum_i k_i(\theta) I(\theta) d\theta$$

$$= \int K(\theta) I(\theta) d\theta$$

$$= K \int I(\theta) d\theta (-\theta_d \le \theta \le \theta_d)$$

Similarly, the term of the numerator of the equation (4) can be transformed like the following equation (7) by using the above equation (5). Here, since the angle sensitivity coefficient $k_i(\theta)$ shown in FIGS. 6A and 6B is expressed by the following equation (8), the term of the numerator of the equation (3) can be expressed like the following equation (9).

$$\sum_i \theta_i I_i' = \sum_i \theta_i \int_{\theta_{i-1}}^{\theta_{i+1}} k_i(\theta) I(\theta) d\theta \quad (7)$$

$$k_i(\theta) = \begin{cases} K \dfrac{\theta - \theta_{i-1}}{\theta_i - \theta_{i-1}} & (\theta_{i-1} \le \theta \le \theta_i) \\ K \dfrac{\theta_{i+1} - \theta}{\theta_{i+1} - \theta_i} & (\theta_i < \theta \le \theta_{i+1}) \end{cases} \quad (8)$$

$$\sum_i \theta_i I_i' = \sum_i \left\{ \theta_i \int_{\theta_{i-1}}^{\theta_i} K \frac{\theta - \theta_{i-1}}{\theta_i - \theta_{i-1}} I(\theta) d\theta + \theta_i \int_{\theta_i}^{\theta_{i+1}} K \frac{\theta_{i+1} - \theta}{\theta_{i+1} - \theta_i} I(\theta) d\theta \right\} \quad (9)$$

Here, in order to calculate the above equation (9), a term in which an integral range is from the first angle $\theta_a$ to the second angle $\theta_b$ will be concretely considered. More specifically, only the terms in which an integral range is from the first angle $\theta_a$ to the second angle $\theta_b$ are derived by setting $\theta_i$ to be $\theta_b$ with respect to the first term on the right side of the equation (9) and setting $\theta_i$ to be $\theta_a$ with respect to the second term on the right side of the equation (9). These terms are expressed by the following equation (10).

$$\theta_b \int_{\theta_a}^{\theta_b} K \frac{\theta - \theta_a}{\theta_b - \theta_a} I(\theta) d\theta + \theta_a \int_{\theta_a}^{\theta_b} K \frac{\theta_b - \theta}{\theta_b - \theta_a} I(\theta) d\theta = \qquad (10)$$

$$\frac{K}{\theta_b - \theta_a} \int_{\theta_a}^{\theta_b} \{(\theta_b - \theta_a)\theta + \theta_a \theta_b - \theta_a \theta_b\} I(\theta) d\theta = K \int_{\theta_a}^{\theta_b} \theta I(\theta) d\theta$$

The above equation (10) represents the integral of the product of the angle θ and the intensity I(θ) of the ion beam by the angle θ. As a result, if the integral range of the equation (9) is extended to the angle measurement range [$-\theta_d$ to $\theta_d$] of the angle measurement device 48, the term of the numerator of the equation (4) becomes equal to K times the term of the numerator of the equation (3). Therefore, the center of gravity of an angle distribution $\theta_G'$ which is obtained by the measurement shown in the above equation (4) and the actual center of gravity of an angle distribution $\theta_G$ shown in the above equation (3) become equal to each other. From the above, according to the angle measurement device 48 of this embodiment, in spite of discretely measuring an angular component with respect to the angle θ by using a small number of (for example, seven) electrode bodies 64, it is possible to accurately determine the center of gravity of an angle distribution $\theta_G$ of the ion beam.

As in this embodiment, in order to obtain the accurate center of gravity of an angle distribution $\theta_G$ of the ion beam, each electrode body 64 with which the angle measurement device 48 is provided needs to have the angle sensitivity coefficient k(θ) as shown in FIG. 6A. In other words, it is necessary to satisfy both of a first condition that the angle sensitivity coefficient k(θ) of each electrode body 64 is a triangle shape and a second condition that each electrode body 64 is disposed such that a measurement omission of a beam does not occur between the electrode bodies adjacent to each other. First, as the first condition, in order to make the angle sensitivity coefficient k(θ) of each electrode body 64 a triangle shape, the length of the first portion 66 of the electrode body 64 in the slit width direction needs to be the same as the slit width S. In a case where the length of the first portion of the electrode body in the slit width direction is shorter than the slit width S, or a case where the length of the first portion of the electrode body in the slit width direction is longer than the slit width S, the angle sensitivity coefficient of the electrode body becomes a trapezoidal shape, and thus a range in which the sensitivity coefficient becomes constant with respect to the angle θ occurs. Then, the above equation (10) is not established, and therefore, a difference occurs between the actual center of gravity of an angle distribution $\theta_G$ and the center of gravity of an angle distribution $\theta_G'$ which is obtained by the measurement, and thus it is not possible to obtain the accurate center of gravity of an angle distribution $\theta_G$. Similarly, if the second condition is not satisfied and a measurement omission of a beam occur between the electrode bodies adjacent to each other, the above equation (6) is not established, and therefore, a difference occurs between the actual center of gravity of an angle distribution $\theta_G$ and the center of gravity of an angle distribution $\theta_G'$ which is obtained by the measurement. On the other hand, according to this embodiment, each electrode body 64 is disposed so as to satisfy these conditions, and therefore, it is possible to obtain the accurate center of gravity of an angle distribution $\theta_G$.

MODIFIED EXAMPLE 1

Figure 8:
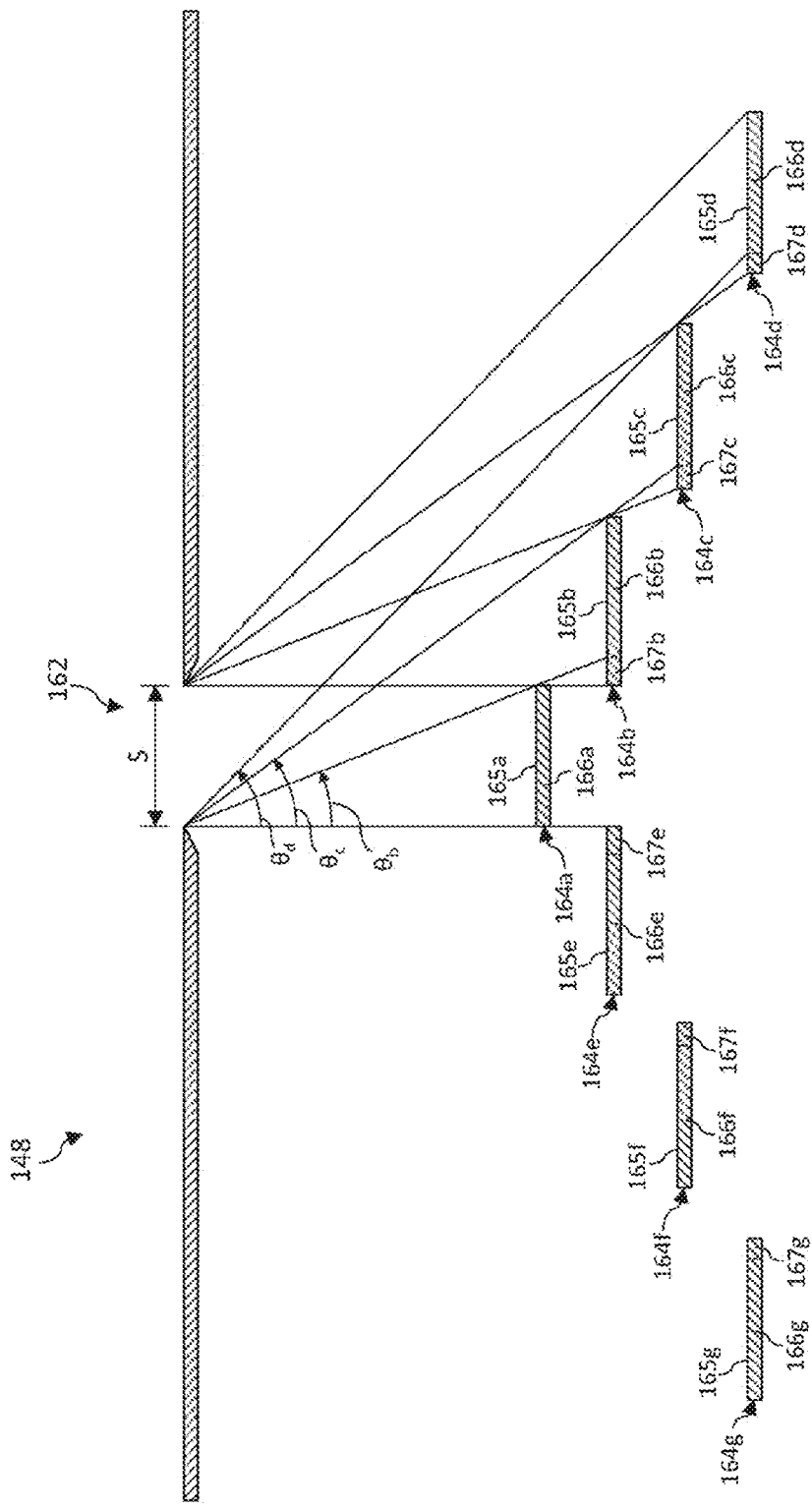
FIG. 8 is a sectional view schematically showing the configuration of an angle measurement device according to Modified Example 1.

FIG. 8 is a sectional view schematically showing the configuration of an angle measurement device 148 according to Modified Example 1. The angle measurement device 148 has a plurality of electrode bodies 164a, 164b, 164c, 164d, 164e, 164f, and 164g (also collectively referred to as an electrode body 164). This modified example is different from the embodiment described above in that the plurality of electrode bodies 164a to 164g are disposed in a mountain shape (an inverted V shape). This modified example will be described focusing on the differences from the angle measurement device 48 described above.

The plurality of electrode bodies 164a to 164g respectively have beam measurement surfaces 165a, 165b, 165c, 165d, 165e, 165f, and 165g (also collectively referred to as a beam measurement surface 165), each of which is a region that is exposed to the ion beam having passed through a slit 162. The plurality of electrode bodies 164a to 164g are disposed such that the beam measurement surfaces 165a to 165g of the electrode bodies are arranged in order in the slit width direction (the x direction) and the beam measurement surfaces 165 adjacent to each other in the x direction deviate from each other in the beam traveling direction (the z direction). The first electrode body 164a is disposed at a position closest to the slit 162 in the beam traveling direction, and the second electrode body 164b, the third electrode body 164c, and the fourth electrode body 164d are disposed in this order on the back side in the beam traveling direction. Similarly, the fifth electrode body 164e, the sixth electrode body 164f, and the seventh electrode body 164g are disposed in this order on the back side in the beam traveling direction.

The first electrode body 164a has a first portion 166a of which a length thereof in the slit width direction is the same as the slit width S. The second electrode body 164b has a first portion 166b in which a length thereof in the slit width direction is the same as the slit width S, and a second portion 167b which is provided on the left side of the first portion 166b and fills up the gap between the second electrode body 164b and the first electrode body 164a. The third electrode body 164c has a first portion 166c in which a length thereof in the slit width direction is the same as the slit width S, and a second portion 167c which is provided on the left side of the first portion 166c and fills up the gap between the third electrode body 164c and the second electrode body 164b. The fourth electrode body 164d has a first portion 166d in which a length thereof in the slit width direction is the same as the slit width S, and a second portion 167d which is provided on the left side of the first portion 166d and fills up the gap between the fourth electrode body 164d and the third electrode body 164c. The fifth electrode body 164e has a first portion 166e and a second portion 167e and is disposed so as to become bilaterally symmetrical to the second electrode body 164b with respect to the slit 162. The sixth electrode body 164f has a first portion 166f and a second portion 167f and is disposed so as to become bilaterally symmetrical to the third electrode body 164c with respect to the slit 162. The seventh electrode body 164g has a first portion 166g and a second portion 167g and is disposed so as to become bilaterally symmetrical to the fourth electrode body 164d with respect to the slit 162. In this modified example, in any of the electrode bodies, a pair of electrode bodies adjacent to each other are disposed so as not to overlap each other in the beam traveling direction. This is because the plurality of electrode bodies 164a to 164g are disposed in a mountain shape (an inverted V shape).

Also in this modified example, it is possible to dispose each electrode body 164 such that the angle sensitivity coefficient k(θ) of each electrode body 164 is a triangular shape and such that a measurement omission of the beam does not occur between the electrode bodies 164 adjacent to each other. Therefore, according to the angle measurement device 148 of this modified example, similar to the embodiment described above, it is possible to obtain the accurate center of gravity of an angle distribution $\theta_G$ with respect to the ion beam incident from the slit 162.

MODIFIED EXAMPLE 2

Figure 9:
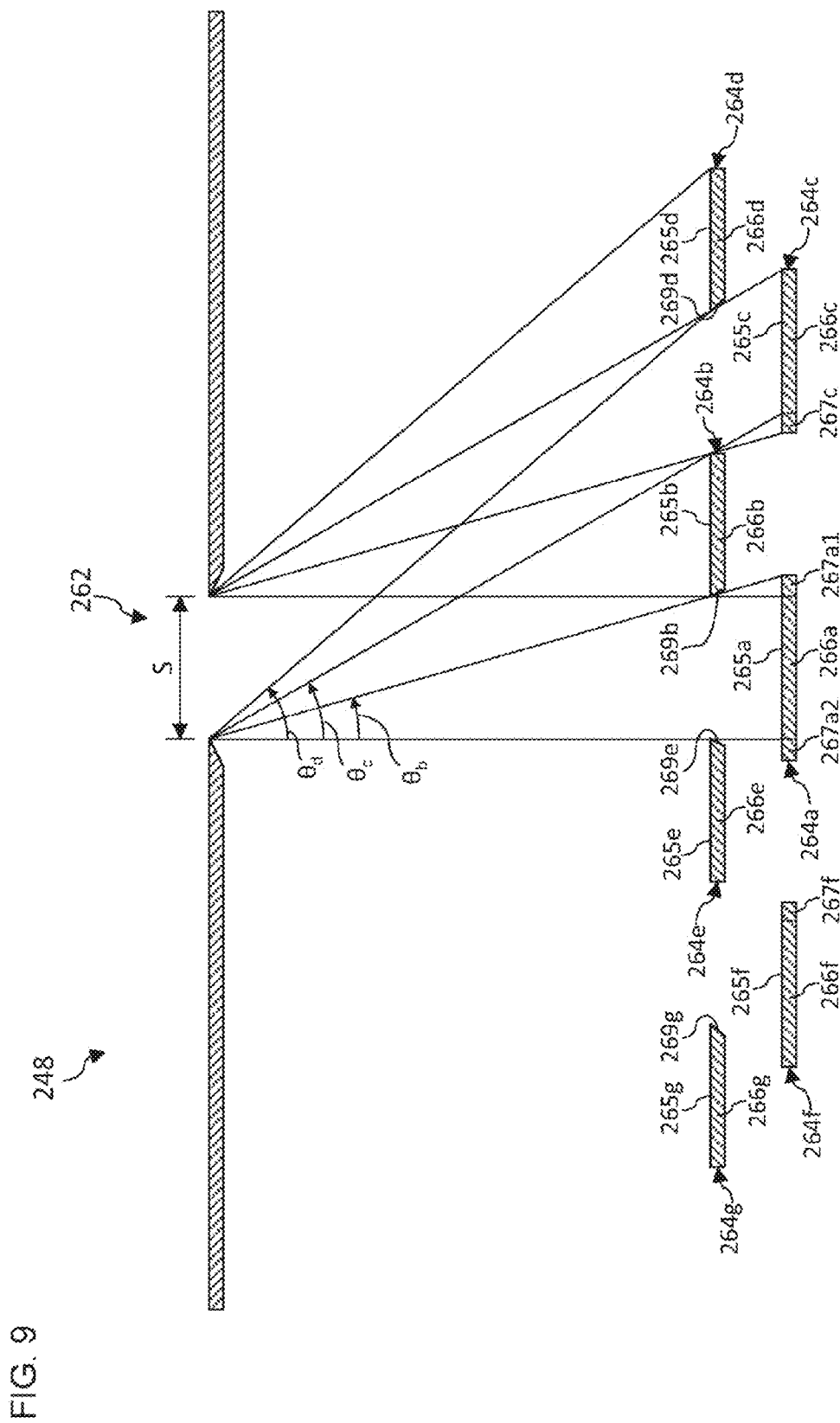
FIG. 9 is a sectional view schematically showing the configuration of an angle measurement device according to Modified Example 2.

FIG. 9 is a sectional view schematically showing the configuration of an angle measurement device 248 according to Modified Example 2. The angle measurement device 248 has a plurality of electrode bodies 264a, 264b, 264c, 264d, 264e, 264f, and 264g (also collectively referred to as an electrode body 264). This modified example is different from the embodiment described above in that the plurality of electrode bodies 264a to 264g are disposed alternately in a zigzag pattern. This modified example will be described focusing on the differences from the angle measurement device 48 described above.

The plurality of electrode bodies 264a to 264g respectively have beam measurement surfaces 265a, 265b, 265c, 265d, 265e, 265f, and 265g (also collectively referred to as a beam measurement surface 265), each of which is a region that is exposed to the ion beam having passed through a slit 262. The plurality of electrode bodies 264a to 264g are disposed such that the beam measurement surfaces 265a to 265g of the electrode bodies are arranged in order in the slit width direction (the x direction) and the beam measurement surfaces 265 adjacent to each other in the x direction deviate from each other in the beam traveling direction (the z direction). The first electrode body 264a, the third electrode body 264c, and the sixth electrode body 264f are disposed on the back side in the beam traveling direction when viewed from the slit 262, and the remaining electrode bodies, which are the second electrode body 264b, the fourth electrode body 264d, the fifth electrode body 264e, and the seventh electrode body 264g, are disposed on the front side in the beam traveling direction when viewed from the slit 262.

The first electrode body 264a has a first portion 266a and second portions 267a1 and 267a2. The second electrode body 264b has a first portion 266b, and a tapered portion 269b provided on the left side thereof. The third electrode body 264c has a first portion 266c and a second portion 267c. The fourth electrode body 264d has a first portion 266d, and a tapered portion 269d provided on the left side thereof. The fifth electrode body 264e has a first portion 266e, and a tapered portion 269e provided on the right side thereof. The sixth electrode body 264f has a first portion 266f and a second portion 267f. The seventh electrode body 264g has a first portion 266g, and a tapered portion 269g provided on the right side thereof. Therefore, in each of the electrode bodies which are disposed on the back side in the beam traveling direction, the first portion and the second portion are provided. On the other hand, in each of the electrode bodies which are disposed on the front side in the beam traveling direction, only the first portion is provided and the tapered portion is provided so as not to interrupt the beam component heading for the second portion of the adjacent electrode body.

Also in this modified example, it is possible to dispose each electrode body 264 such that the angle sensitivity coefficient $k(\theta)$ of each electrode body 264 is a triangular shape and such that a measurement omission of the beam does not occur between the electrode bodies 264 adjacent to each other. Therefore, according to the angle measurement device 248 of this modified example, similar to the embodiment described above, it is possible to obtain the accurate center of gravity of an angle distribution $\theta_G$ with respect to the ion beam incident from the slit 262.

MODIFIED EXAMPLE 3

Figure 10:
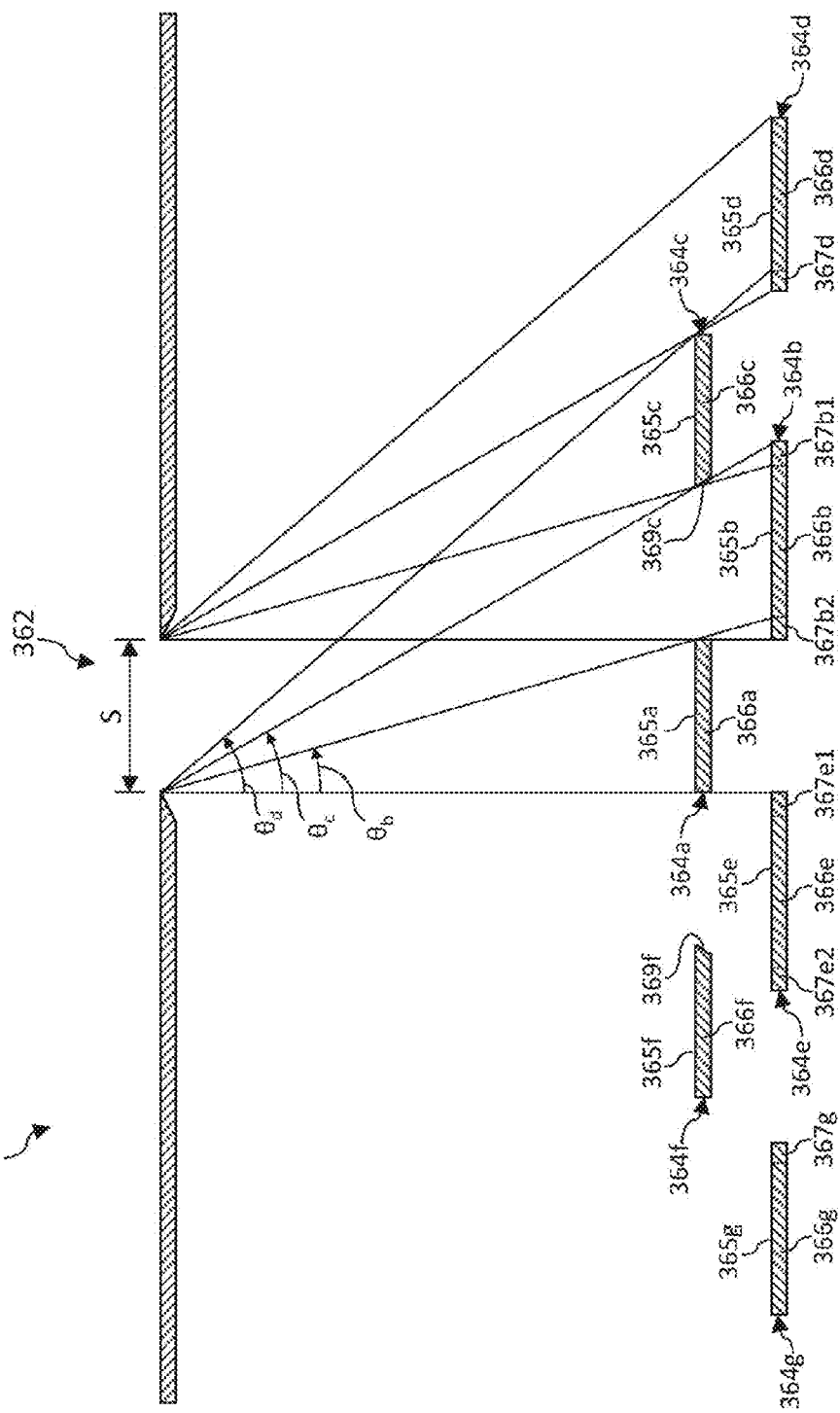
FIG. 10 is a sectional view schematically showing the configuration of an angle measurement device according to Modified Example 3.

FIG. 10 is a sectional view schematically showing the configuration of an angle measurement device 348 according to Modified Example 3. The angle measurement device 348 has a plurality of electrode bodies 364a, 364b, 364c, 364d, 364e, 364f, and 364g (also collectively referred to as an electrode body 364). In this modified example, similar to Modified Example 2, the plurality of electrode bodies 364a to 364g are disposed alternately in a zigzag pattern, and on the other hand, this modified example is different from Modified Example 2 in that the first electrode body 364a of the center is disposed on the front side. This modified example will be described focusing on the differences from the angle measurement device 248 according to Modified Example 2 described above.

The plurality of electrode bodies 364a to 364g respectively have beam measurement surfaces 365a, 365b, 365c, 365d, 365e, 365f, and 365g (also collectively referred to as a beam measurement surface 365), each of which is a region that is exposed to the ion beam having passed through a slit 362. The first electrode body 364a, the third electrode body 364c, and the sixth electrode body 364f are disposed on the front side in the beam traveling direction when viewed from the slit 362, and the remaining electrode bodies, which are the second electrode body 364b, the fourth electrode body 364d, the fifth electrode body 364e, and the seventh electrode body 364g, are disposed on the back side in the beam traveling direction when viewed from the slit 362.

The first electrode body 364a has a first portion 366a. The second electrode body 364b has a first portion 366b, and second portions 367b1 and 367b2 which are provided on both the right and left sides. The third electrode body 364c has a first portion 366c, and a tapered portion 369c provided on the left side thereof. The fourth electrode body 364d has a first portion 366d and a second portion 367d. The fifth electrode body 364e has a first portion 366e, and second portions 367e1 and 367e2 which are provided on both the right and left sides. The sixth electrode body 364f has a first portion 366f, and a tapered portion 369f provided on the right side thereof. The seventh electrode body 364g has a first portion 366g and a second portion 367g. Therefore, also in this modified example, in each of the electrode bodies which are disposed on the back side in the beam traveling direction, the first portion and the second portion are provided. On the other hand, in each of the electrode bodies which are disposed on the front side in the beam traveling direction, only the first portion is provided and the tapered portion is provided so as not to interrupt the beam component heading for the second portion of the adjacent electrode body.

Also in this modified example, it is possible to dispose each electrode body 364 such that the angle sensitivity coefficient $k(\theta)$ of each electrode body 364 is a triangular shape and such that a measurement omission of the beam does not occur between the electrode bodies 364 adjacent to each other. Therefore, according to the angle measurement device 348 of this modified example, similar to the embodiment described above, it is possible to obtain the accurate center of gravity of an angle distribution $\theta_G$ with respect to the ion beam incident from the slit 362.

MODIFIED EXAMPLE 4

Figure 11:
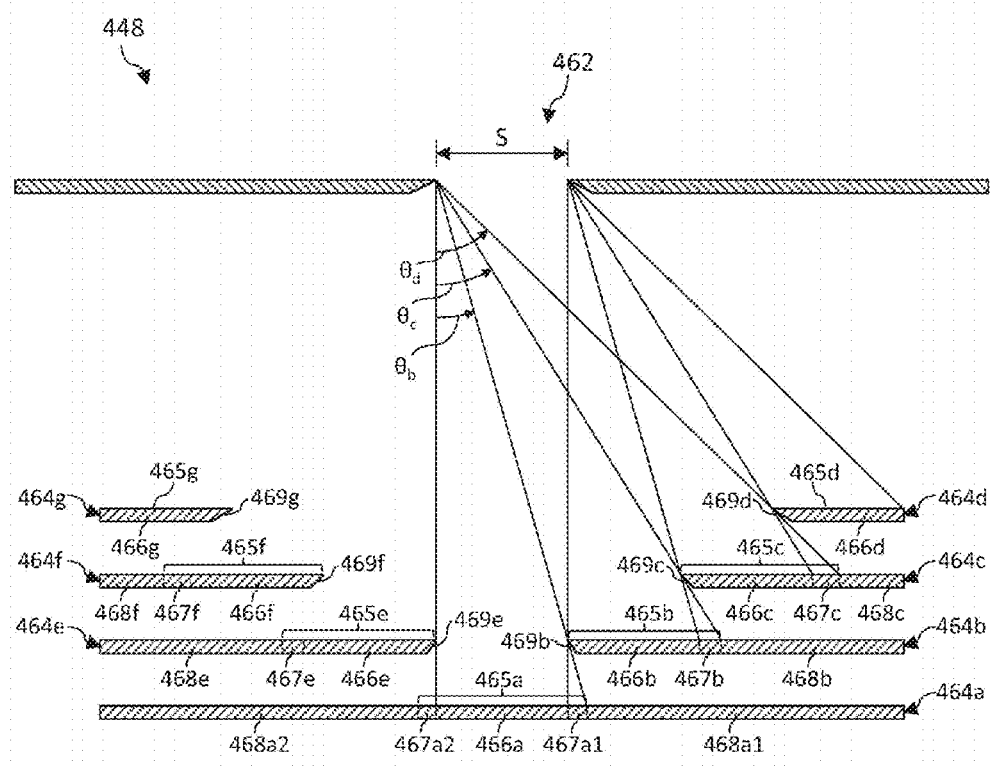
FIG. 11 is a sectional view schematically showing the configuration of an angle measurement device according to Modified Example 4.

FIG. 11 is a sectional view schematically showing the configuration of an angle measurement device 448 according to Modified Example 4. The angle measurement device 448 has a plurality of electrode bodies 464a, 464b, 464c, 464d, 464e, 464f, and 464g (also collectively referred to as an electrode body 464). In this modified example, beam measurement surfaces 465a, 465b, 465c, 465d, 465e, 465f, and 465g (also collectively referred to as a beam measurement surface 465) of the electrode bodies 464a to 464g are configured in a manner similar to the embodiment described above. On the other hand, this modified example is different from the embodiment described above in that a third portion which is not exposed to the ion beam having passed through the slit 462 and does not function as the beam measurement surface 465 is provided in a part of the electrode body 464. This modified example will be described focusing on the differences from the angle measurement device 48 according to the embodiment described above.

The plurality of electrode bodies 464a 464g are disposed such that the beam measurement surfaces 465a to 465g are arranged in order in the slit width direction (the x direction) and the beam measurement surfaces 465 adjacent to each other in the X direction deviate from each other in the beam traveling direction (the z direction). Specifically, the first beam measurement surface 465a is disposed on the deepest side in the beam traveling direction, and the fourth beam measurement surface 465d and the seventh beam measurement surface 465g which are disposed at both right and left ends are disposed on the shallowest side in the beam traveling direction. Each of the beam measurement surfaces 465a to 465g is configured of only a first portion in which a length thereof in the slit width direction is the same as the slit width S, or alternatively, is configured of a first portion and a second portion which is disposed next to the first portion.

The first electrode body 464a has a first portion 466a, second portions 467a1 and 467a2, and third portions 468a1 and 468a2. The third portions 468a1 and 468a2 of the first electrode body 464a are respectively disposed next to the second portions 467a1 and 467a2. The third portions 468a1 and 468a2 of the first electrode body 464a are disposed on the back side of the other electrode bodies 464b to 464g which are disposed on the front side in the beam traveling direction, and therefore, the third portions 468a1 and 468a2 are regions on which the ion beam is not incident, and do not affect the ion beam measurement result. However, by providing the third portions 468a1 and 468a2, it is possible to increase the degree of freedom of a structure for supporting the first electrode body 464a. For example, it is possible to fix the first electrode body 464a at a desired position by using support structures (not shown) which are provided on the right side and the left side of the third portions 468a1 and 468a2.

The second electrode body 464b has a first portion 466b, a second portion 467b, a third portion 468b, and a tapered portion 469b provided on the left side thereof. The third portion 468b of the second electrode body 464b is provided at a position where the incidence of the ion beam is interrupted by the third electrode body 464c and the fourth electrode body 464d which are disposed on the front side thereof in the beam traveling direction. The third electrode body 464c has a first portion 466c, a second portion 467c, a third portion 468c, and a tapered portion 469c provided on the left side thereof. The third portion 468c of the third electrode body 464c is provided at a position where the incidence of the ion beam is interrupted by the fourth electrode body 464d which is disposed on the front side thereof in the beam traveling direction. The fourth electrode body 464d has a first portion 466d, and a tapered portion 469d provided on the left side thereof. The fourth electrode body 464d does not have a third portion, because any electrode body is not disposed on the front side thereof in the beam traveling direction.

The fifth electrode body 464e has a first portion 466e, a second portion 467e, a third portion 468e, and a tapered portion 469e provided on the right side thereof. The fifth electrode body 464e has a shape symmetrical to the second electrode body 464b and is disposed at a position bilaterally symmetrical to the second electrode body 464b with respect to the slit 462. The sixth electrode body 464f has a first portion 466f, a second portion 467f, a third portion 468f, and a tapered portion 469f provided on the right side thereof. The sixth electrode body 464f has a shape symmetrical to the third electrode body 464c and is disposed at a position bilaterally symmetrical to that of the third electrode body 464c with respect to the slit 462. The seventh electrode body 464g has a first portion 466g, and a tapered portion 469g provided on the right side thereof. The seventh electrode body 464g has a shape symmetrical to the fourth electrode 464e and is disposed at a position bilaterally symmetrical to that of the fourth electrode body 464d with respect to the slit 462.

The length of the third portion of each electrode body 464 in the slit width direction is arbitrary and may be shorter or longer than that in the illustrated example as long as the third portion is within a range in which the ion beam having passed through the slit 462 is interrupted by one or more electrode bodies which are disposed on the front side thereof in the beam traveling direction. Further, the third portion of each electrode body 464 may be provided so as to extend over the longitudinal direction (the y direction) of the slit 462, or may be provided only in a part of the range in the longitudinal direction of the slit 462. Further, the third portion may not be provided in all the electrode bodies 464a, 464b, 464c, 464e, and 464f except for the fourth electrode body 464d and the seventh electrode body 464g, or may be provided only in some of the plurality of electrode bodies 464 except for the fourth electrode body 464d and the seventh electrode body 464g.

Also in this modified example, it is possible to dispose each electrode body 464 such that the angle sensitivity coefficient k(θ) of each electrode body 464 is a triangular shape and such that a measurement omission of the beam does not occur between the electrode bodies 464 adjacent to each other. Therefore, according to the angle measurement device 448 of this modified example, similar to the embodiment described above, it is possible to obtain the accurate center of gravity of an angle distribution $\theta_G$ with respect to the ion beam incident from the slit 462. Further, according to this modified example, it is possible to increase the degree of freedom of a structure for fixing each electrode body 464.

MODIFIED EXAMPLE 5

Figure 12:
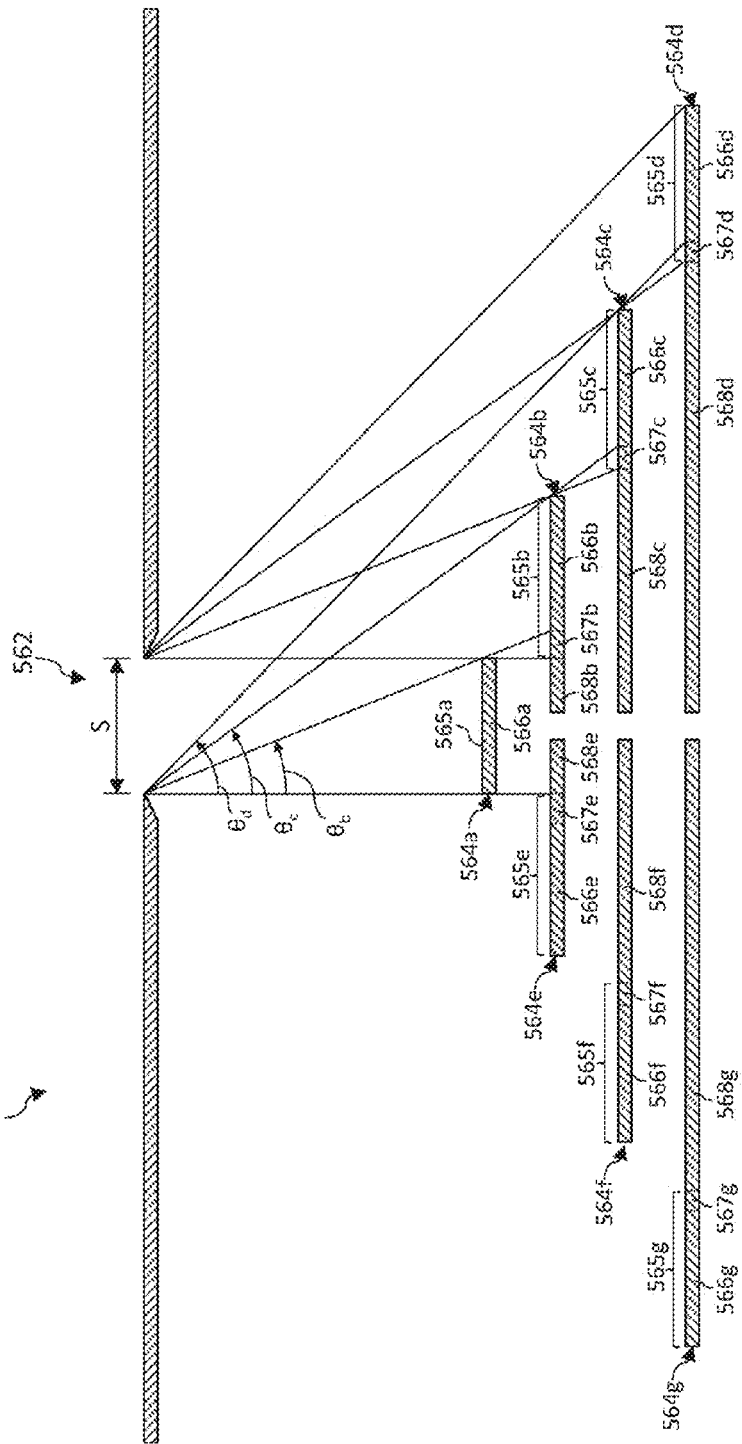
FIG. 12 is a sectional view schematically showing the configuration of an angle measurement device according to Modified Example 5.

FIG. 12 is a sectional view schematically showing the configuration of an angle measurement device 548 according to Modified Example 5. The angle measurement device 548 has a plurality of electrode bodies 564a, 564b, 564c, 564d, 564e, 564f, and 564g (also collectively referred to as an electrode body 564). In this modified example, beam measurement surfaces 565a, 565b, 565c, 565d, 565e, 565f, and 565g (also collectively referred to as a beam measurement surface 565) of the electrode bodies 564a to 564g are configured in a manner similar to Modified Example 1, and on the other hand, this modified example is different from Modified Example 1 in that a third portion which is not exposed to the ion beam having passed through the slit 562 is provided in a part of the electrode body 564. This modified example will be described focusing on the differences from the angle measurement device 148 according to Modified Example 1 described above.

The plurality of electrode bodies 564a 564g are disposed such that the beam measurement surfaces 565a to 565g are arranged in order in the slit width direction (the X direction) and the beam measurement surfaces 565 adjacent to each other in the x direction deviate from each other in the beam traveling direction (the z direction). Specifically, the first beam measurement surface 565a is disposed on the shallowest side in the beam traveling direction, and the fourth beam measurement surface 565d and the seventh beam measurement surface 565g which are disposed at both right and left ends are disposed on the deepest side in the beam traveling direction. Each of the beam measurement surfaces 565a to 565g is configured of only a first portion in which a length thereof in the slit width direction is the same as the slit width S, or alternatively, is configured of a first portion and a second portion which is disposed next to the first portion.

The first electrode body 564a has a first portion 566a. The second electrode body 564b has a first portion 566b, a second portion 567b, and a third portion 568b. The third electrode body 564c has a first portion 566c, a second portion 567c, and a third portion 568c. The fourth electrode body 564d has a first portion 566d, a second portion 567d, and a third portion 568d. The fifth electrode body 564e has a first portion 566e, a second portion 567e, and a third portion 568e and is disposed such that a gap is provided between itself and the second electrode body 564b. The sixth electrode body 564f has a first portion 566f, a second portion 567f, and a third portion 568f and is disposed such that a gap is provided between itself and the third electrode body 564c. The seventh electrode body 564g has a first portion 566g, a second portion 567g, and a third portion 568g and is disposed such that a gap is provided between itself and the fourth electrode body 564d.

Also in this modified example, the length of the third portion of each electrode body 564 in the slit width direction is arbitrary and may be shorter or longer than that in the illustrated example as long as the third portion is within a range in which the ion beam having passed through the slit 562 is interrupted by one or more electrode bodies which are disposed on the front side thereof in the beam traveling direction. Further, the third portion of each electrode body 564 may be provided so as to extend over the longitudinal direction (the y direction) of the slit 562, or may be provided only in a part of the range in the longitudinal direction of the slit 562. Further, the third portion may not be provided in all the electrode bodies 564b to 564g except for the first electrode body 564a, or may be provided only in some of the plurality of electrode bodies 564 except for the first electrode body 564a.

Also in this modified example, it is possible to dispose each electrode body 564 such that the angle sensitivity coefficient k(θ) of each electrode body 564 is a triangular shape and such that a measurement omission of the beam does not occur between the electrode bodies 564 adjacent to each other. Therefore, according to the angle measurement device 548 of this modified example, similar to the embodiment described above, it is possible to obtain the accurate center of gravity of an angle distribution $\theta_G$ with respect to the ion beam incident from the slit 562.

MODIFIED EXAMPLE 6

Figure 13:
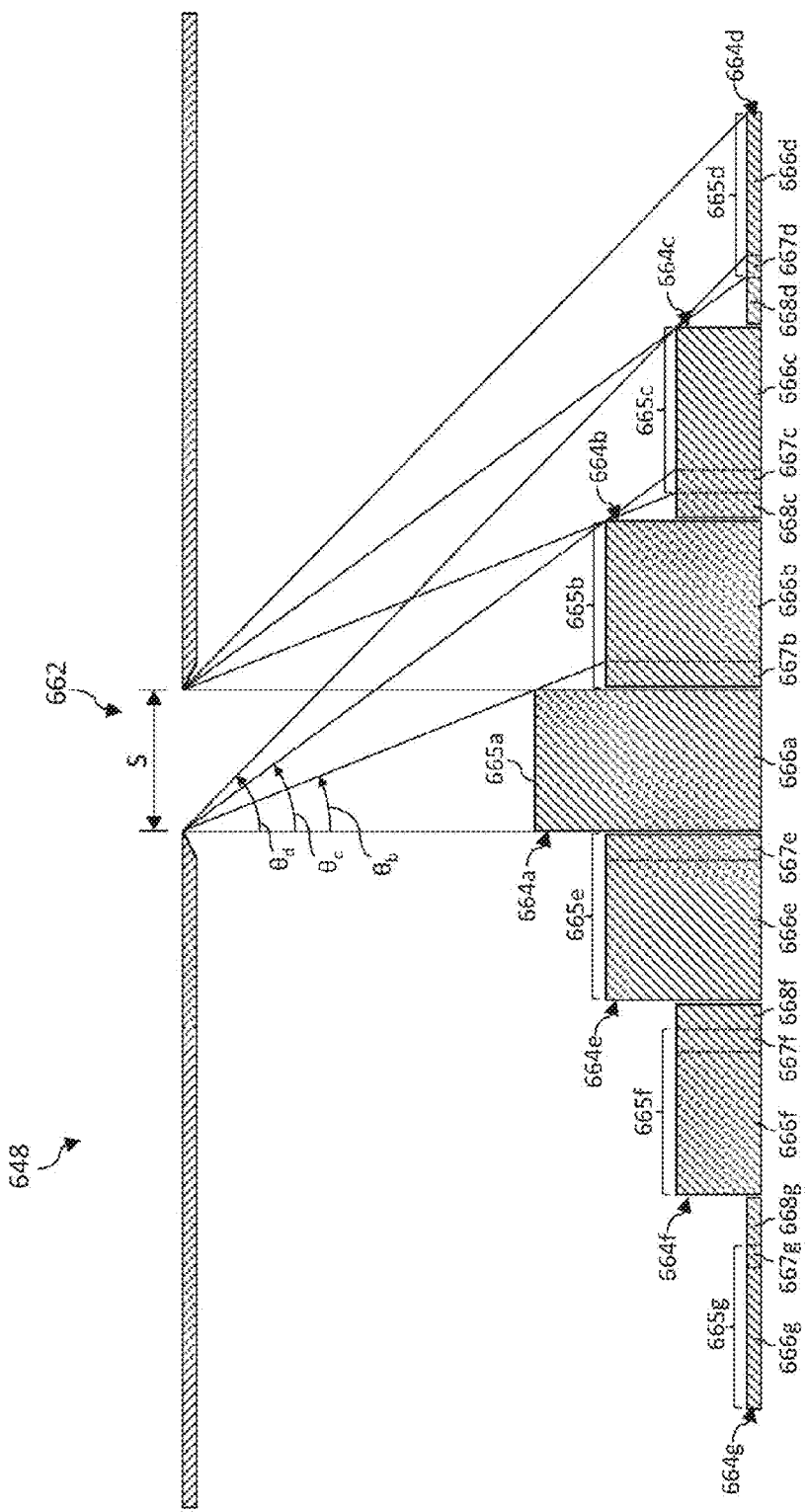
FIG. 13 is a sectional view schematically showing the configuration of an angle measurement device according to Modified Example 6.

FIG. 13 is a sectional view schematically showing the configuration of an angle measurement device 648 according to Modified Example 6. The angle measurement device 648 has a plurality of electrode bodies 664a, 664b, 664c, 664d, 664e, 664f, and 664g (also collectively referred to as an electrode body 664). In this modified example, beam measurement surfaces 665a, 665b, 665c, 665d, 665e, 665f, and 665g (also collectively referred to as a beam measurement surface 665) of the electrode bodies 664a to 664g are configured in a manner similar to Modified Example 5, and on the other hand, this modified example is different from Modified Example 5 in that the thicknesses of some of the electrode bodies 664 in the beam traveling direction are large. This modified example will be described focusing on the differences from the angle measurement device 548 according to Modified Example 5 described above.

The plurality of electrode bodies 664a to 664g are configured such that the thicknesses from the beam measurement surface 665 to the back surface opposite to the beam measurement surface 665 in the beam traveling direction are different, and are configured such that the positions of the back surfaces of the respective electrode bodies 664 are aligned. As a result, the electrode body 664 having the beam measurement surface 665 which is closer to the slit 662 has a larger thickness in the beam traveling direction, and the electrode body 664 having the beam measurement surface 665 which is farther from the slit 662 has a smaller thickness in the beam traveling direction. As shown in the drawing, the thickness in the beam traveling direction of the first electrode body 664a which is disposed at the center is large, and the thicknesses in the beam traveling direction of the fourth electrode body 664d and the seventh electrode body 664g which are disposed both right and left ends are small.

The first electrode body 664a has a first portion 666a. The second electrode body 664b has a first portion 666b and a second portion 667b. The third electrode body 664c has a first portion 666c, a second portion 667c, and a third portion 668c. The fourth electrode body 664d has a first portion 666d, a second portion 667d, and a third portion 668d. The fifth electrode body 664e has a first portion 666e and a second portion 667e. The sixth electrode body 664f has a first portion 666f, a second portion 667f, and a third portion 668f. The seventh electrode body 664g has a first portion 666g, a second portion 667g, and a third portion 668g. A slight gap is provided between the electrode bodies 664 adjacent to each other. The gap is required in order to secure the insulation between the electrode bodies. However, it is preferable that the gap is as small as possible in order to obtain the accurate center of gravity of an angle distribution $\theta_G$. With respect to the third electrode body 664c, the fourth electrode body 664d, the sixth electrode body 664f, and the seventh electrode body 664g, the length of the third portion in the slit width direction may be made to be small, or alternatively, the gap between the electrode bodies 664 adjacent to each other may be secured by eliminating the third portion.

Also in this modified example, it is possible to dispose each electrode body 664 such that the angle sensitivity coefficient k(θ) of each electrode body 664 is a triangular shape and such that a measurement omission of the beam does not occur between the electrode bodies 664 adjacent to each other. Therefore, according to the angle measurement device 648 of this modified example, similar to the embodiment described above, it is possible to obtain the accurate center of gravity of an angle distribution $\theta_G$ with respect to the ion beam incident from the slit 662. Further, according to this modified example, since the back surfaces of the respective electrode bodies 664 are disposed so as to be aligned, fixing of each electrode body 664 becomes easy.

MODIFIED EXAMPLE 7

Figure 14:
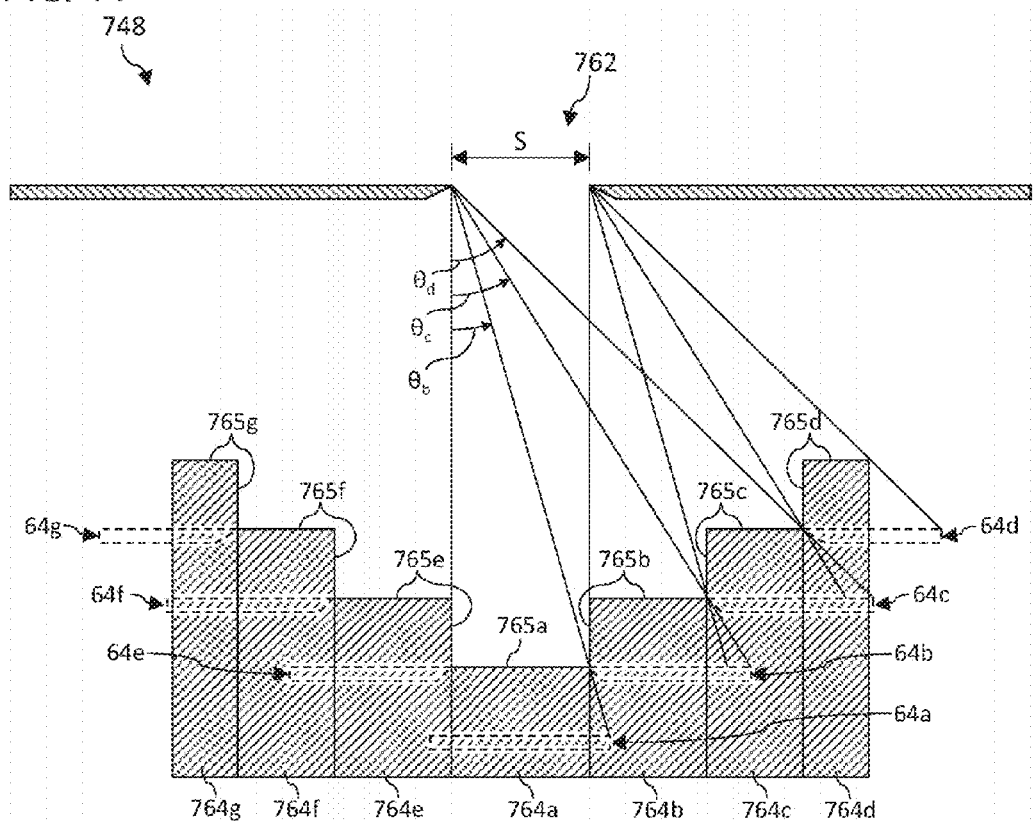
FIG. 14 is a sectional view schematically showing the configuration of an angle measurement device according to Modified Example 7.

FIG. 14 is a sectional view schematically showing the configuration of an angle measurement device 748 according to Modified Example 7. The angle measurement device 748 has a plurality of electrode bodies 764a, 764b, 764c, 764d, 764e, 764f, and 764g (also collectively referred to as an electrode body 764). In this modified example, each electrode body 764 is disposed such that the same angle sensitivity coefficient $k(\theta)$ as those of the electrode bodies 64a to 64g according to the embodiment described above is realized, and the positions of the electrode bodies 64a to 64g according to the embodiment described above are indicated by broken lines. This modified example is different from the embodiment described above and modified examples in that each of beam measurement surfaces 765a, 765b, 765c, 765d, 765e, 765f, and 765g (also collectively referred to as a beam measurement surface 765) of the electrode bodies 764a to 764g is configured of not only the upper surface of the electrode body 764 but also a part of the side surface of that. This modified example will be described focusing on the differences from the angle measurement device 48 according to the embodiment described above.

The plurality of electrode bodies 764a to 764g are configured so as to have different thicknesses in the beam traveling direction and are configured such that the positions of the back surfaces of the respective electrode bodies 764 are aligned. As a result, the electrode body 764 having the beam measurement surface 765 which is closer to a slit 762 has a larger thickness in the beam traveling direction, and the electrode body 764 having the beam measurement surface 765 which is farther from the slit 762 has a smaller thickness in the beam traveling direction. As shown in the drawing, the thickness in the beam traveling direction of the first electrode body 764a which is disposed at the center is small, and the thicknesses in the beam traveling direction of the fourth electrode body 764d and the seventh electrode body 764g which are disposed both right and left ends are large.

Each of the beam measurement surfaces 765 is disposed at such a position as to be able to measure all the beam components which are incident on virtual beam measurement surfaces which are corresponding to the beam measurement surfaces of the electrode bodies 64a to 64g according to the embodiment described above. Specifically, the first beam measurement surface 765a is disposed so as to fill up the gap between the second electrode body 64b and the fifth electrode body 64e according to the embodiment. The second beam measurement surface 765b is disposed so as to fill up the gap between the first beam measurement surface 765a and the third electrode body 64c according to the embodiment. The third beam measurement surface 765c is disposed so as to fill up the gap between the second beam measurement surface 765b and the fourth electrode body 64d according to the embodiment. The fourth beam measurement surface 765d is disposed at such a position as to interrupt all the beam components heading for the fourth electrode body 64d according to the embodiment. Similarly, the fifth beam measurement surface 765e is disposed so as to fill up the gap between the first beam measurement surface 765a and the sixth electrode body 64f according to the embodiment. The sixth beam measurement surface 765f is disposed so as to fill up the gap between the fifth beam measurement surface 765e and the seventh electrode body 64g according to the embodiment. The seventh beam measurement surface 765g is disposed at such a position as to interrupt all the beam components heading for the seventh electrode body 64g according to the embodiment. By configuring each electrode body 764 in this manner, it is possible to realize the angle measurement device 748 having the same angle sensitivity coefficient as that of the angle measurement device 48 according to the embodiment.

Therefore, also in this modified example, it is possible to dispose each electrode body 764 such that the angle sensitivity coefficient $k(\theta)$ of each electrode body 764 is a triangular shape and such that a measurement omission of the beam does not occur between the electrode bodies 764 adjacent to each other. Accordingly, similar to the embodiment described above, it is possible to obtain the accurate center of gravity of an angle distribution $\theta_G$ with respect to the ion beam incident from the slit 762. Further, according to this modified example, since the back surfaces of the respective electrode bodies 764 are disposed so as to be aligned, fixing of each electrode body 764 becomes easy.

MODIFIED EXAMPLE 8

Figure 15:
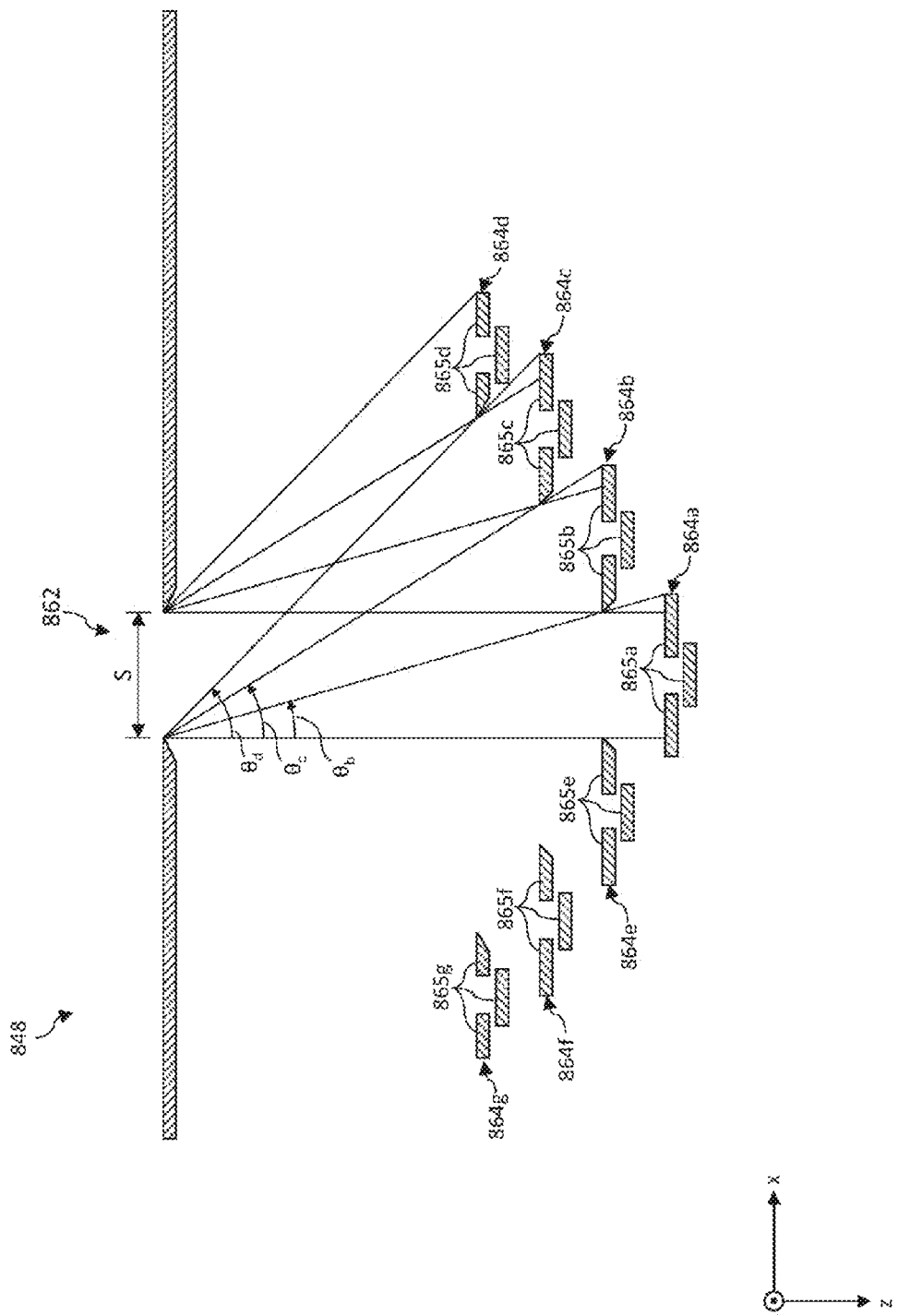
FIG. 15 is a sectional view schematically showing the configuration of an angle measurement device according to Modified Example 8.

FIG. 15 is a sectional view schematically showing the configuration of an angle measurement device 848 according to Modified Example 8. In this modified example, each of the plurality of electrode bodies 64a to 64g shown in the embodiment described above is divided into a plurality of small electrodes, and a set of beam measurement surface is configured of the plurality of small electrodes (a small electrode group). This modified example will be described focusing on the differences from the embodiment described above.

The angle measurement device 848 has a plurality of electrode bodies 864a, 864b, 864c, 864d, 864e, 864f, and 864g (also collectively referred to as an electrode body 864). Each of the plurality of electrode bodies 864a to 864g has three small electrodes. The three small electrodes of each electrode body 864 are disposed such that beam measurement surfaces thereof deviate from each other in the beam traveling direction, and are disposed, for example, in a V shape, as shown in the drawing. Each of beam measurement surfaces 865a, 865b, 865c, 865d, 865e, 865f, and 865g (also collectively referred to as a beam measurement surface 865) of the electrode bodies 864a to 864g is configured of the three small electrode that each electrode body 864 has. As a result, the angle sensitivity coefficient $k(\theta)$ of each electrode body 864 corresponds to the sum of the angle sensitivity coefficients of the respective small electrodes. Also in this modified example, each electrode body 864 is configured so as to have the same angle sensitivity coefficient $k(\theta)$ as that of the electrode body 64 according to the embodiment described above, and therefore, it is possible to obtain the accurate center of gravity of an angle distribution $\theta_G$ with respect to the ion beam incident from a slit 862.

The number of small electrodes of each electrode body 864 is not limited to three and may be two or may be four or more. Further, the number of small electrodes of each of the plurality of electrode bodies 864a to 864g may be the same, or the respective electrode bodies may have a different number of small electrodes. Further, in the illustrated example, a case where each electrode body 864 is divided in the slit width direction (the x direction) is shown, whereas each electrode body 864 may be divided in the longitudinal direction of the slit 862 (the y direction), and each electrode body 864 may be divided in both the slit width direction and the longitudinal direction.

MODIFIED EXAMPLE 9

FIG. 16 is a sectional view schematically showing the configuration of an angle measurement device 948 according to Modified Example 9. The angle measurement device 948 has a plurality of electrode bodies 964a, 964b, 964c, 964d, 964e, 964f, and 964g (also collectively referred to as an electrode body 964). This modified example is different from the embodiment described above and modified examples in that beam measurement surfaces 965a, 965b, 965c, 965d, 965e, 965f, and 965g (also collectively referred to as a beam measurement surface 965) of the electrode bodies 964a to 964g are disposed so as to be present at the same position (distance L) in the beam traveling direction. Each beam measurement surface 965 is disposed such that the length thereof in the slit width direction is the same as the slit width S and a gap hardly occurs between the electrode bodies adjacent to each other. Also in this modified example, each electrode body 964 is configured so as to have the same angle sensitivity coefficient k(θ) as that of the electrode body 64 according to the embodiment described above, and therefore, it is possible to obtain the accurate center of gravity of an angle distribution $\theta_G$ with respect to the ion beam incident from a slit 962.

As a further modified example, each electrode body 964 may be divided into a plurality of small electrodes. For example, a configuration may be made such that each electrode body 964 is divided into n (n is an integer greater than or equal to 2) small electrodes, whereby the length of each small electrode in the slit width direction becomes 1/n times the slit width S (that is, S/n). Even in a case where each electrode body 964 is divided into n small electrodes, the small electrode group which is composed of n small electrodes has the same angle sensitivity coefficient k(θ) as that of the electrode body 64 according to the embodiment described above, and therefore, similar to the embodiment described above, it is possible to obtain the accurate center of gravity of an angle distribution $\theta_G$ with respect to the ion beam incident from the slit 962.

The present invention has been described above with reference to the embodiments described above. However, the present invention is not limited to the embodiments described above, and appropriate combinations or substitutions of the configurations of the embodiments are also included in the present invention. Further, it is also possible to appropriately rearrange the order of a combination or process in the embodiments on the basis of the knowledge of a person skilled in the art, or to add modifications such as various design changes to the embodiment, and embodiments with such modifications added thereto can also be included within the scope of the present invention.

In the embodiment described above, a case where the angle measurement device 48 is provided in the movable center cup 42 is shown. As a further modified example, the angle measurement device according to the embodiment described above or each modified example may be provided in the fixed type side cups 40 (40R and 40L).

In the embodiment described above and modified examples, a case is shown where the angle measurement device is disposed such that the slit width direction of the slit is in the x direction in order to measure an angular component in the x direction which is the beam scanning direction. As a further modified example, the angle measurement device may be disposed such that the slit width direction is in the y direction in order to measure an angular component in the y direction orthogonal to the beam scanning direction. Further, in order for the respective angular components in the x and y directions to be measurable, a first angle measurement device which is disposed such that the slit width direction is in the x direction and a second angle measurement device which is disposed such that the slit width direction is in the y direction may be used in combination.

In the embodiment described above and modified examples, the disposition of the electrode bodies is shown in which the first electrode body is disposed in front of the slit and bilaterally symmetric (plane-symmetric) disposition is made with respect to a plane extending in the beam traveling direction from the central portion of the slit. As a further modified example, the respective electrode bodies may not be disposed so as to be symmetrical on the basis of the position of the slit. For example, the first electrode body which is disposed in front of the slit may be disposed at a position shifted from the central portion of the slit. Further, the number of electrode bodies which are provided may not be an odd number and may be an even number.

It should be understood that the invention is not limited to the embodiment described above, but may be modified into various forms on the basis of the spirit of the invention. Additionally, the modifications are included in the scope of the invention.

What is claimed is:

1. An ion implantation apparatus comprising a measurement device configured to measure an angle distribution of an ion beam with which a wafer is irradiated, the measurement device including:
    a slit through which the ion beam is incident, and a width direction of which is orthogonal to a beam traveling direction of the ion beam toward the wafer; and
    a plurality of electrode bodies which are provided at positions away from the slit in the beam traveling direction, and each of which includes a beam measurement surface that is a region which is exposed to the ion beam having passed through the slit,
    wherein the plurality of electrode bodies are disposed such that the beam measurement surfaces of the electrode bodies are arranged in order in the width direction of the slit and the beam measurement surfaces adjacent to each other in the width direction of the slit deviate from each other in the beam traveling direction, and
    wherein the plurality of electrode bodies are disposed such that the beam measurement surfaces of the electrode bodies are arranged in a V shape or an inverted V shape when viewed in a cross section defined by the beam traveling direction and the width direction of the slit.

2. The ion implantation apparatus according to claim 1, wherein the plurality of electrode bodies are disposed such that at least one set of the electrode bodies including beam measurement surfaces adjacent to each other in the width direction of the slit overlap each other in the beam traveling direction.

3. The ion implantation apparatus according to claim 1, wherein the plurality of electrode bodies are configured such that an electrode body including a beam measurement surface positioned on a downstream side in the beam traveling direction is longer in the width direction of the slit than an electrode body including a beam measurement surface positioned on an upstream side in the beam traveling direction.

4. The ion implantation apparatus according to claim 1, wherein the beam measurement surface of at least one of the plurality of electrode bodies has a length in the width direction of the slit which is the same as a slit width of the slit.

5. An ion implantation apparatus comprising a measurement device configured to measure an angle distribution of an ion beam with which a wafer is irradiated, the measurement device including:
- a slit through which the ion beam is incident, and a width direction of which is orthogonal to a beam traveling direction of the ion beam toward the wafer; and
- a plurality of electrode bodies which are provided at positions away from the slit in the beam traveling direction, and each of which includes a beam measurement surface that is a region which is exposed to the ion beam having passed through the slit,
- wherein the plurality of electrode bodies are disposed such that the beam measurement surfaces of the electrode bodies are arranged in order in the width direction of the slit and the beam measurement surfaces adjacent to each other in the width direction of the slit deviate from each other in the beam traveling direction,
- wherein the beam measurement surface of at least one of the plurality of electrode bodies has a length in the width direction of the slit which is the same as a slit width of the slit, and
- wherein at least one of the electrode bodies, the beam measurement surface of which has the same length in the width direction of the slit as the slit width of the slit, includes a beam measurement surface that is positioned on the further upstream side with respect to at least one of other electrode bodies in the beam traveling direction.

6. The ion implantation apparatus according to claim 5, wherein the beam measurement surface of the at least one of other electrode bodies has a length in the width direction of the slit longer than the slit width of the slit.

7. The ion implantation apparatus according to claim 1, wherein the plurality of electrode bodies are configured such that a positional deviation in the beam traveling direction between beam measurement surfaces adjacent to each other in the width direction of the slit is smaller than the slit width of the slit.

8. The ion implantation apparatus according to claim 1, wherein the plurality of electrode bodies are disposed such that the beam measurement surfaces of the electrode bodies are arranged in the width direction of the slit without gaps therebetween when viewed from the ion beam passing through the slit.

9. The ion implantation apparatus according to claim 1, wherein at least one of the plurality of electrode bodies has a shape in which the length in the width direction of the slit decreases in the beam traveling direction.

10. The ion implantation apparatus according to claim 1, wherein the plurality of electrode bodies are disposed such that at least one set of the electrode bodies including beam measurement surfaces adjacent to each other in the width direction of the slit do not overlap each other in the beam traveling direction.

11. The ion implantation apparatus according to claim 1, wherein each of the plurality of electrode bodies is disposed such that each electrode body measures beam components of the ion beam having passed through the slit, the components corresponding to a predetermined angular range containing a central angle value differently defined for each electrode body, and such that a central angle value defined for other electrode bodies including beam measurement surfaces adjacent to each other in the width direction of the slit is an upper limit value or a lower limit value of the predetermined angular range.

12. The ion implantation apparatus according to claim 11, wherein the measurement device calculates the center of gravity of the angle distribution of the ion beam having passed through the slit using measurement results from each of the plurality of electrode bodies and the central angle value defined for each of the plurality of electrode bodies.

13. The ion implantation apparatus according to claim 11, wherein the beam measurement surface of at least one of the plurality of electrode bodies includes a plurality of small electrodes, and the plurality of small electrodes are disposed in such a way as to deviate from each other in the beam traveling direction.

14. The ion implantation apparatus according to claim 1, further comprising a beam scanner configured to scan the wafer with the ion beam in a reciprocating manner in a scanning direction orthogonal to the beam traveling direction,
wherein the slit is provided such that the width direction of the slit is aligned with the scanning direction.

15. The ion implantation apparatus according to claim 1, further comprising a beam scanner configured to scan the wafer with the ion beam in a reciprocating manner in a scanning direction orthogonal to the beam traveling direction,
wherein the slit is provided such that the width direction of the slit is aligned with a direction orthogonal to both the beam traveling direction and the scanning direction.

16. A measurement device that measures an angle distribution of an ion beam, the device comprising:
- a slit through which the ion beam is incident; and
- a plurality of electrode bodies which are provided at positions away from the slit in a beam traveling direction, and each of which includes a beam measurement surface that is a region which is exposed to the ion beam having passed through the slit,
- wherein the plurality of electrode bodies are disposed such that
- the beam measurement surfaces of the electrode bodies are arranged in order in a width direction of the slit and the beam measurement surfaces adjacent to each other in the width direction of the slit deviate from each other in the beam traveling direction; and
- wherein the plurality of electrode bodies are disposed such that the beam measurement surfaces of the electrode bodies are arranged in a V shape or an inverted V shape when viewed in a cross section defined by the beam traveling direction and the width direction of the slit.

* * * * *